United States Patent
Kim et al.

(10) Patent No.: US 7,567,085 B2
(45) Date of Patent: Jul. 28, 2009

(54) DIAGNOSIS FOR EXPECTED LIFE OF EMERGENCY POWER APPARATUS

(75) Inventors: Deuk-Soo Kim, Seoul (KR); Rae-Young Kim, Seoul (KR); Gi-Taek Kim, Chunchurn (KR)

(73) Assignee: Powertron Eng'g Co., Ltd., Seoul (KR)

( * ) Notice: Subject to any disclaimer, the term of this patent is extended or adjusted under 35 U.S.C. 154(b) by 436 days.

(21) Appl. No.: 10/545,452

(22) PCT Filed: Apr. 22, 2004

(86) PCT No.: PCT/KR2004/000919

§ 371 (c)(1),
(2), (4) Date: Aug. 12, 2005

(87) PCT Pub. No.: WO2004/099791

PCT Pub. Date: Nov. 18, 2004

(65) Prior Publication Data

US 2006/0152224 A1 Jul. 13, 2006

(30) Foreign Application Priority Data

Apr. 23, 2003 (KR) .................... 10-2003-0025823
May 6, 2003 (KR) .................... 10-2003-0028521

(51) Int. Cl.
*G01N 27/416* (2006.01)

(52) U.S. Cl. .................... 324/426; 324/429; 324/430

(58) Field of Classification Search ................. 324/426, 324/429, 430
See application file for complete search history.

(56) References Cited

U.S. PATENT DOCUMENTS

| | | | |
|---|---|---|---|
| 4,361,809 A | 11/1982 | Bil et al. | |
| 4,423,379 A * | 12/1983 | Jacobs et al. ................. | 324/429 |
| 4,816,768 A * | 3/1989 | Champlin .................... | 324/428 |
| 5,148,043 A | 9/1992 | Hirata et al. | |
| 6,424,158 B2 | 7/2002 | Klang | |
| 2002/0180445 A1 * | 12/2002 | Bertness et al. ............. | 324/426 |
| 2003/0105601 A1 | 6/2003 | Kobayashi et al. | |

FOREIGN PATENT DOCUMENTS

| | | |
|---|---|---|
| JP | 11-49446 | 2/1999 |
| JP | 2002-350521 | 12/2002 |
| JP | 2003-123847 | 4/2003 |
| JP | 2003-163035 | 6/2003 |
| KR | 1020010099534 | 11/2001 |

* cited by examiner

*Primary Examiner*—Adolf Berhane
*Assistant Examiner*—Yalkew Fantu
(74) *Attorney, Agent, or Firm*—Lowe Hauptman Ham & Berner, LLP

(57) ABSTRACT

An emergency power diagnosis system measures the exact value of impedance voltage (Vis) from an AC actual waveform ($V_{SM}$) includes circuits and software operable to measure the effective resistance of battery internal impedance to determine the expected life of a battery string. The system is configured to determine the cause of aging progress in advance and determine by unmanned monitoring the real-time status of emergency power system at a remote site.

8 Claims, 14 Drawing Sheets

[Fig 1]
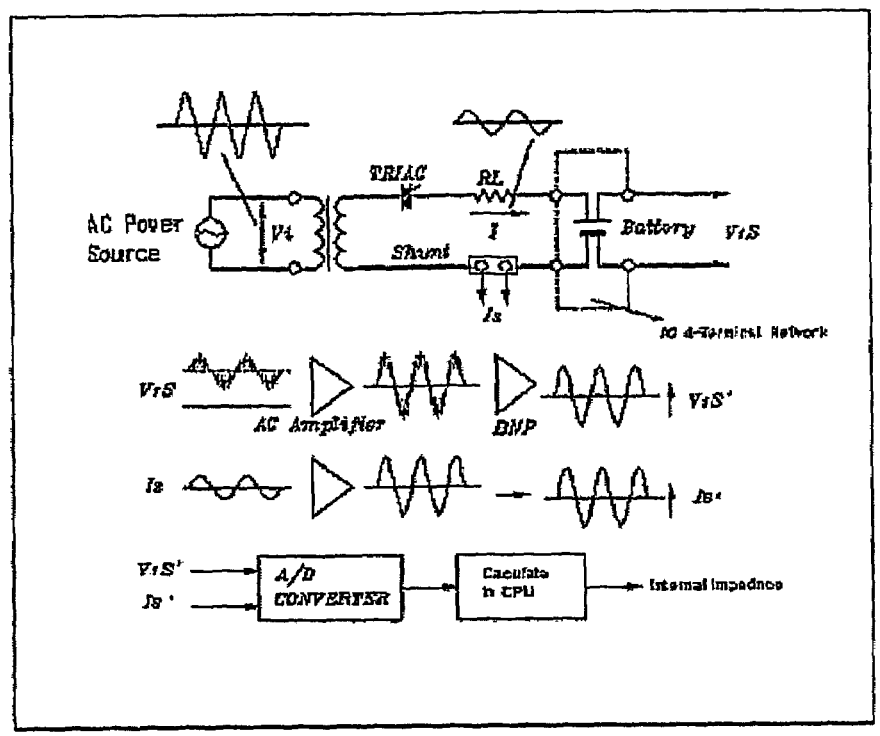
[Fig 2]
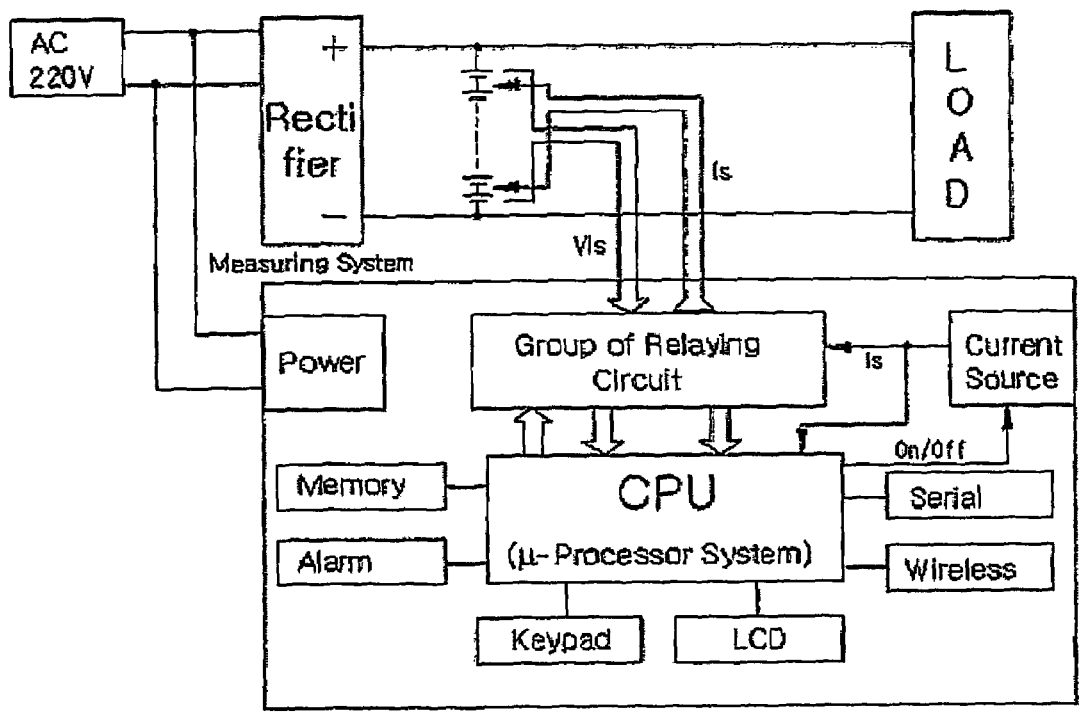

[Fig 3]
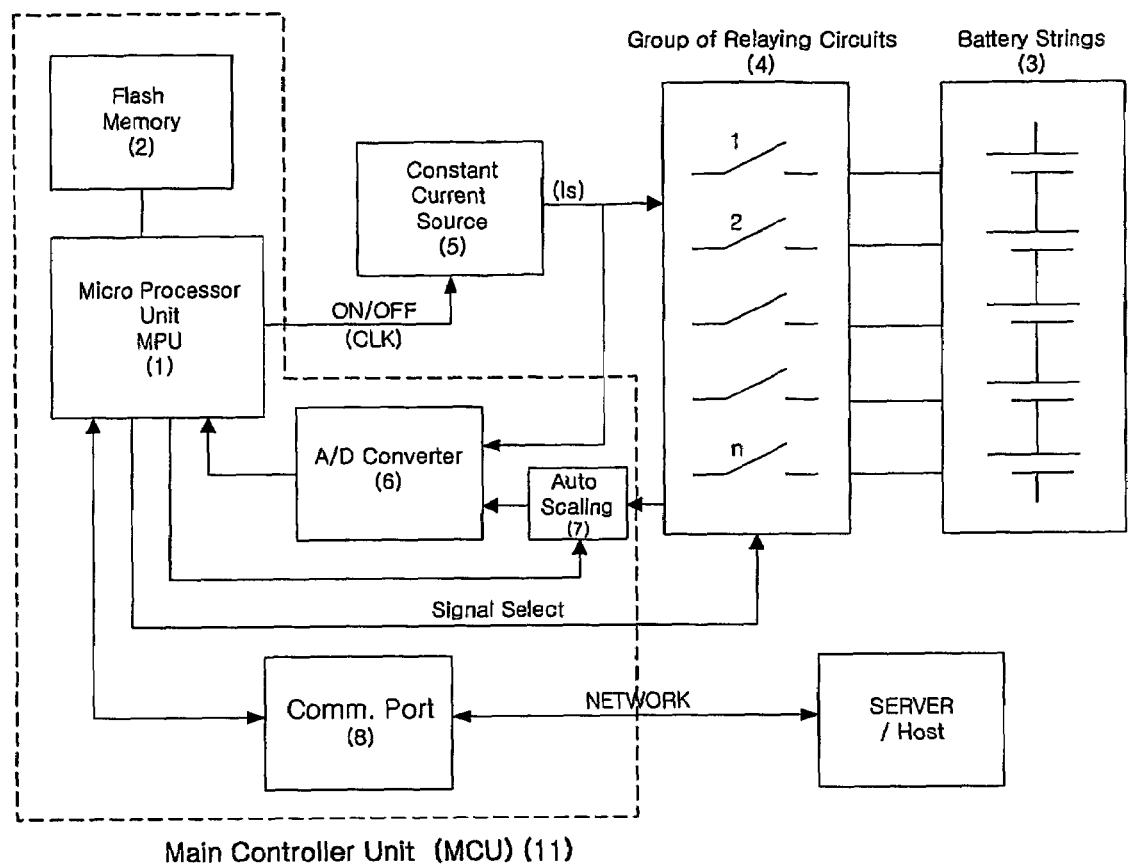

[Fig 4]
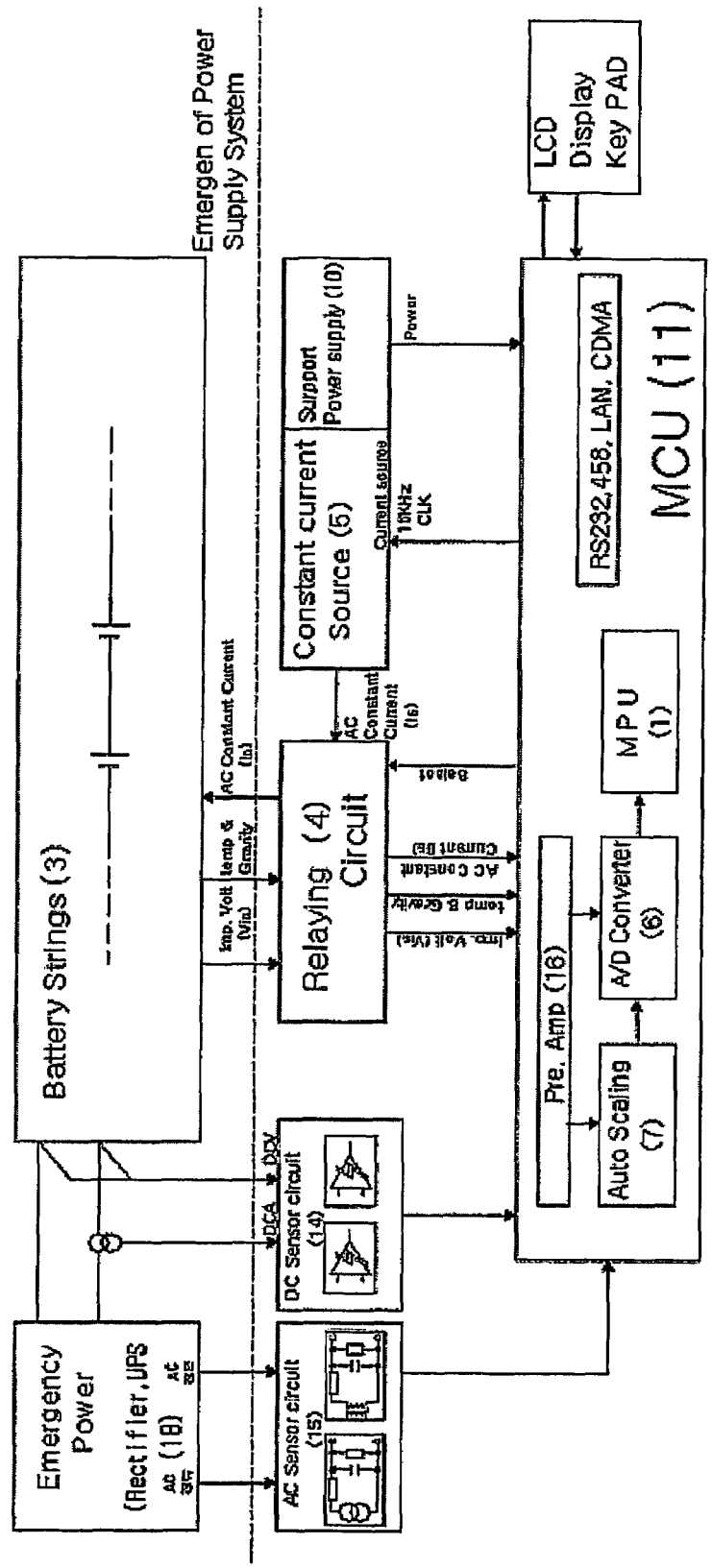

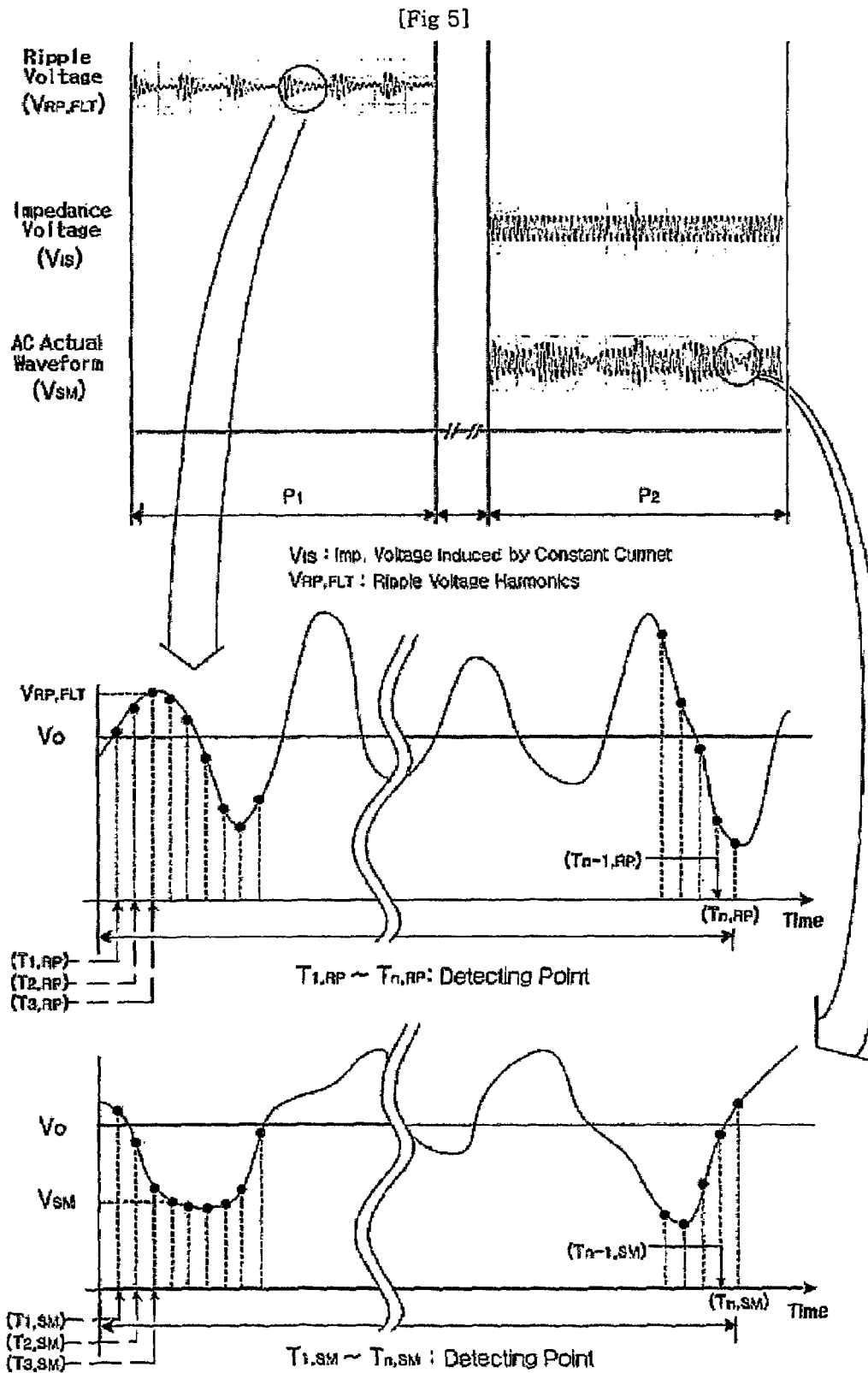

[Fig 6]
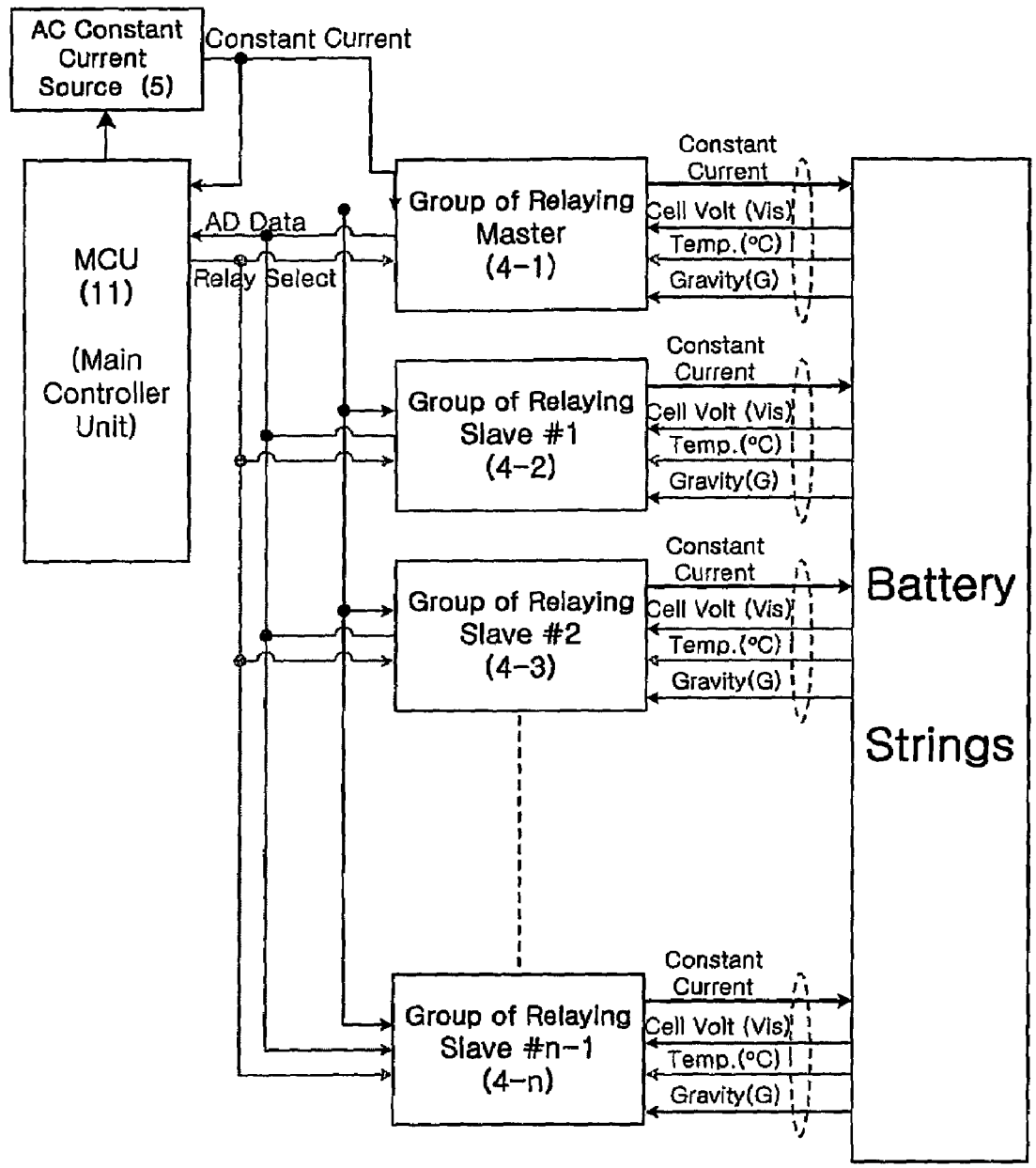

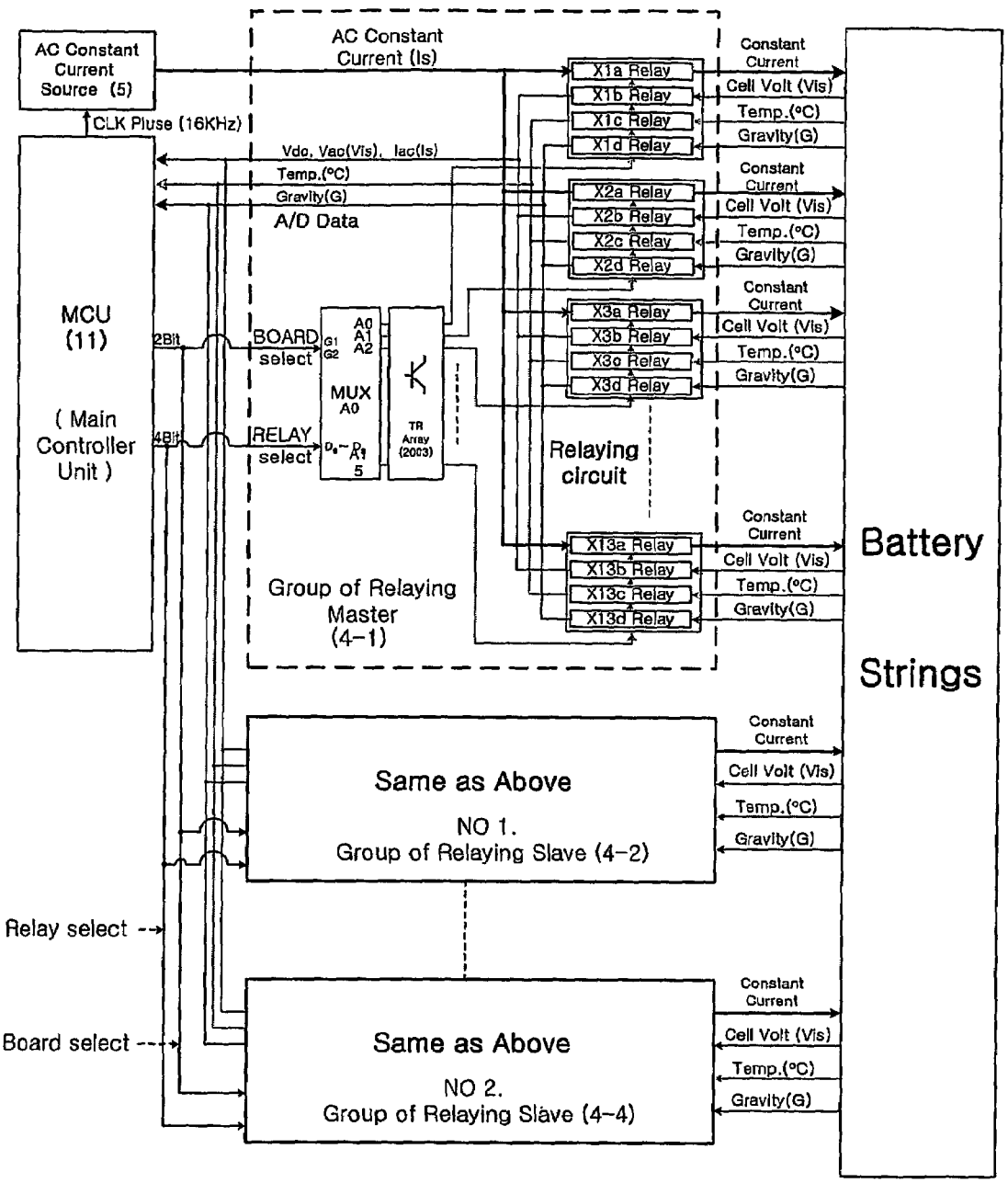
[Fig 7]

[Fig 8]
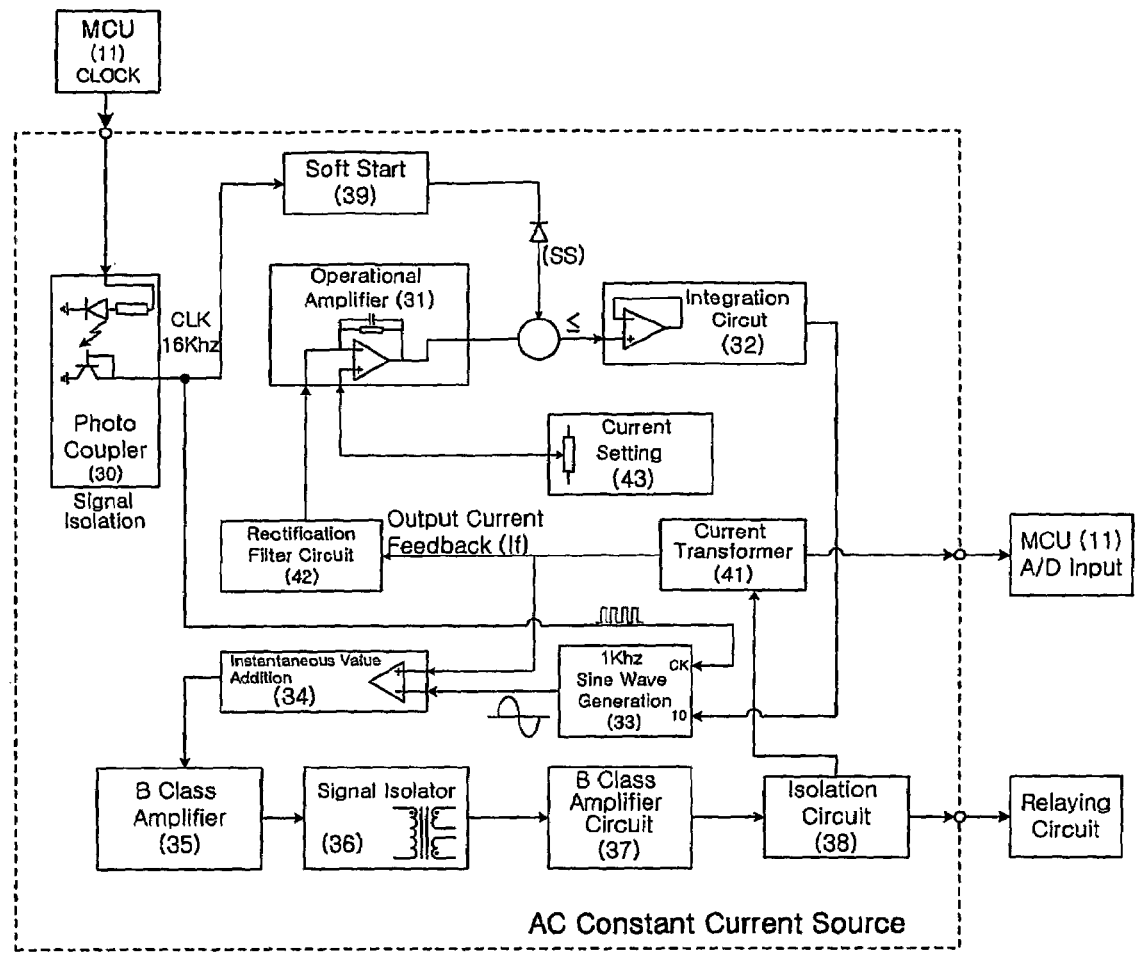

[Fig 9]
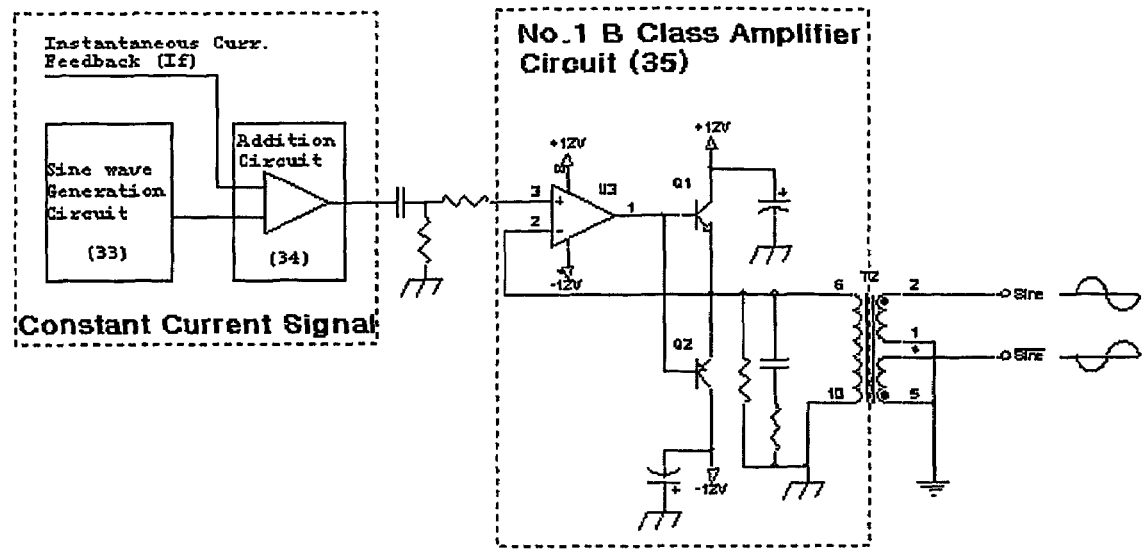
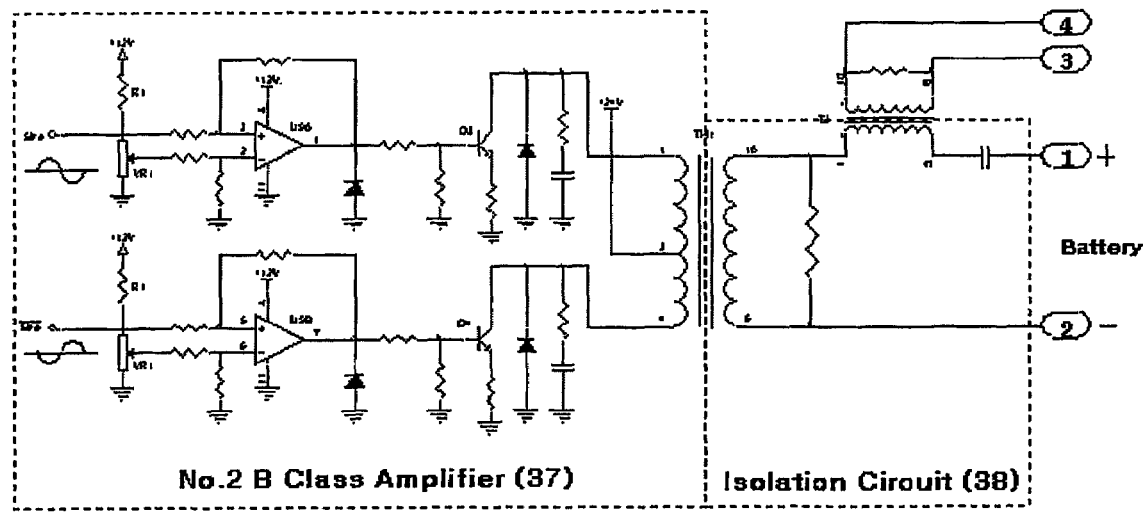

[Fig 10]
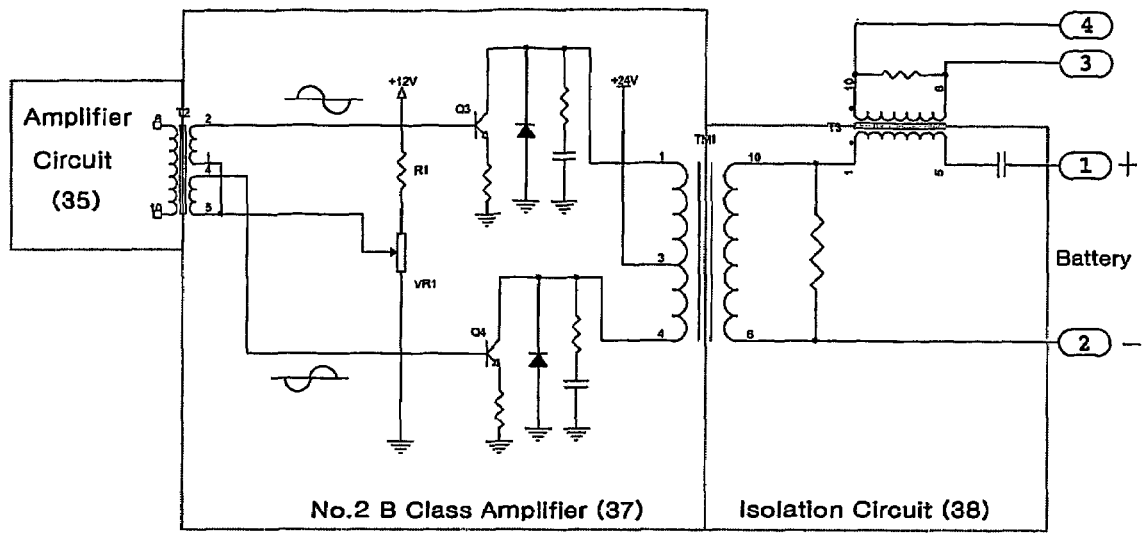
[Fig 11]
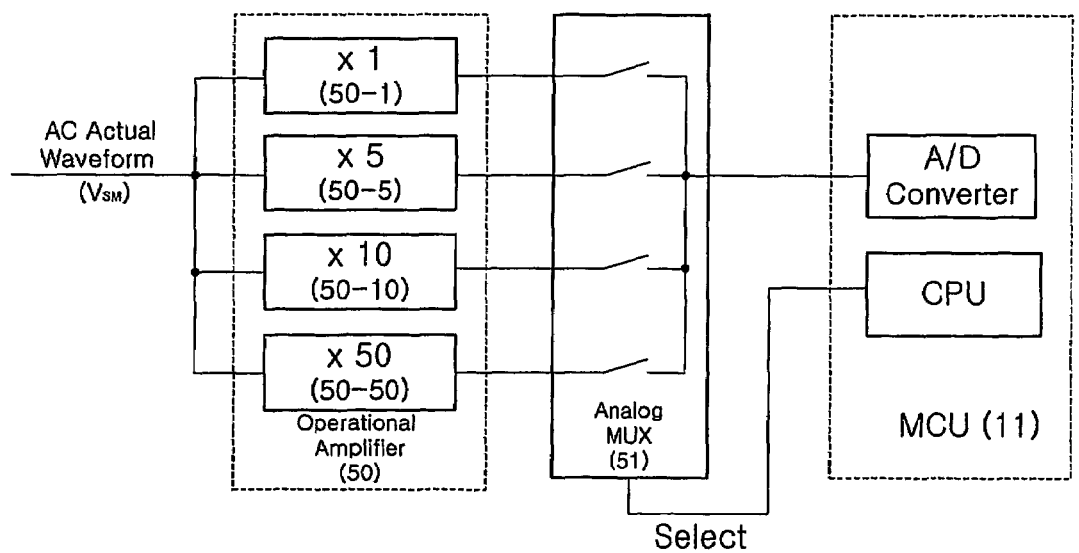

[Fig 12]
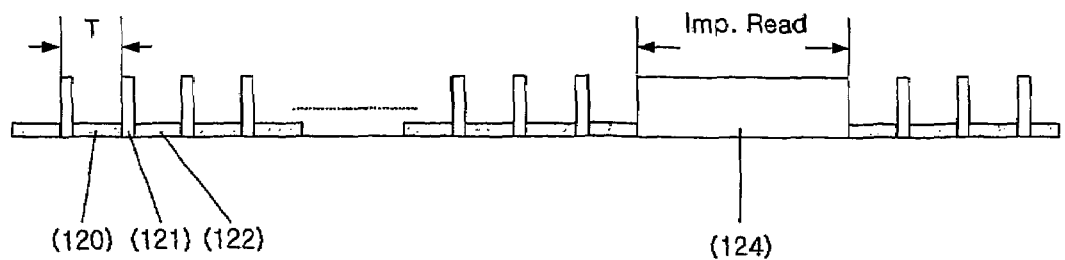
[Fig 13]
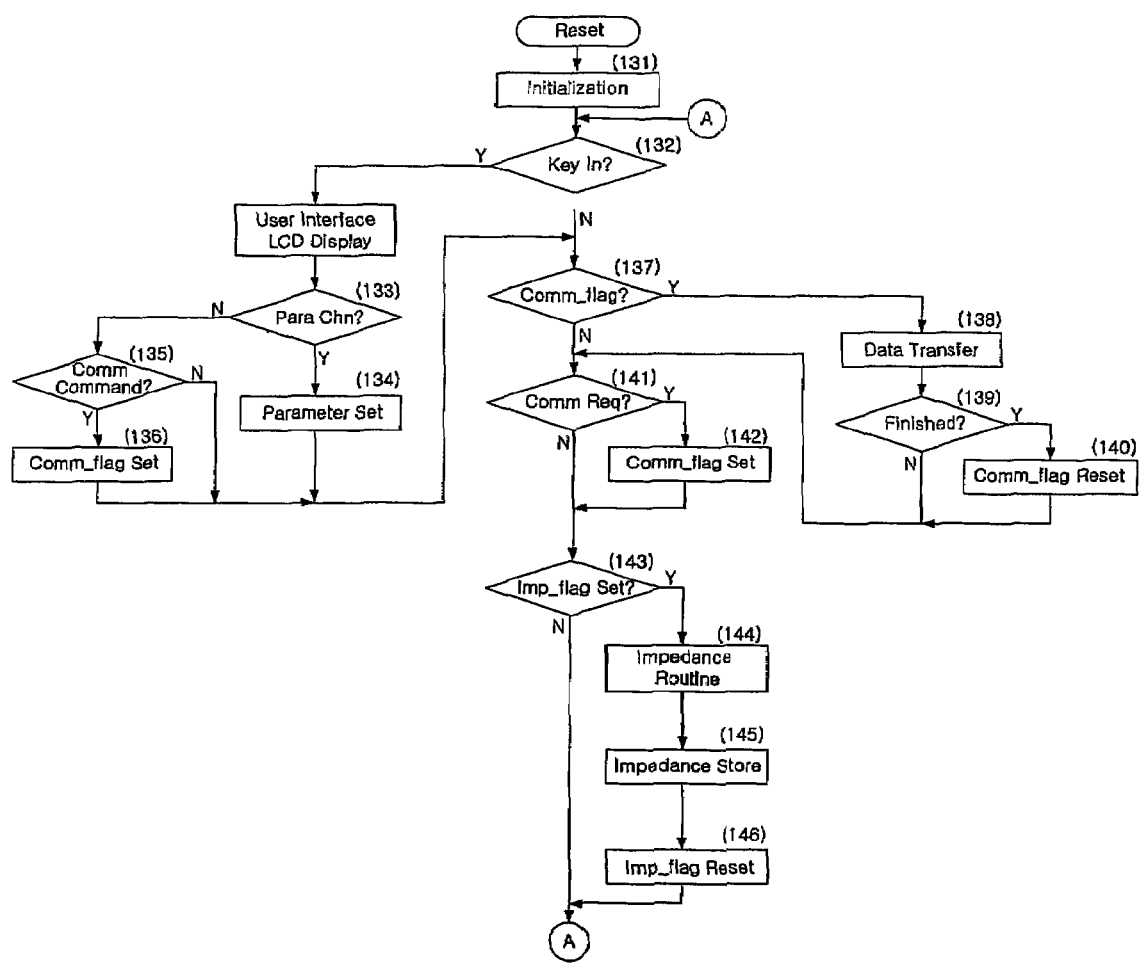

[Fig 14]
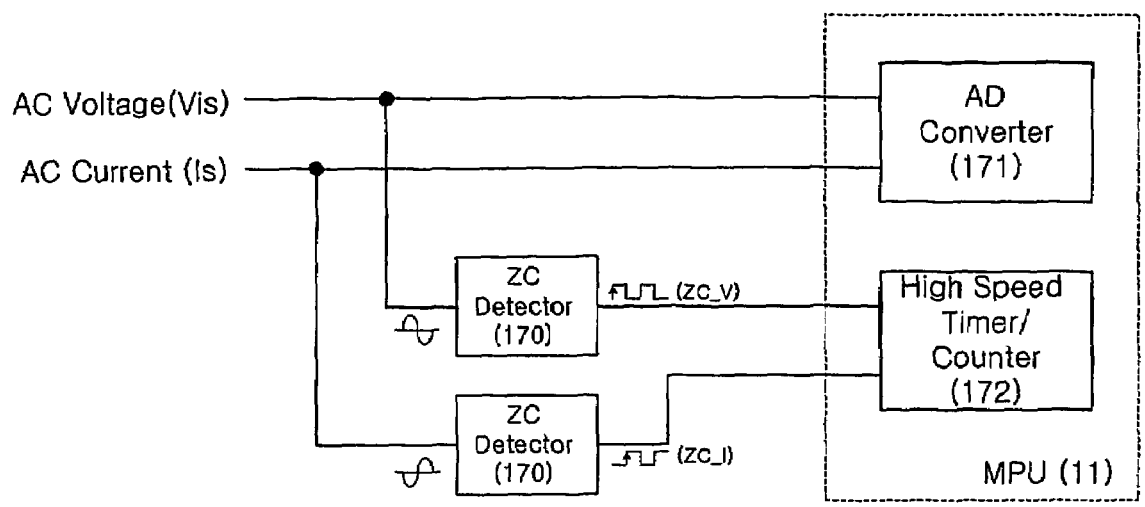

[Fig 15]
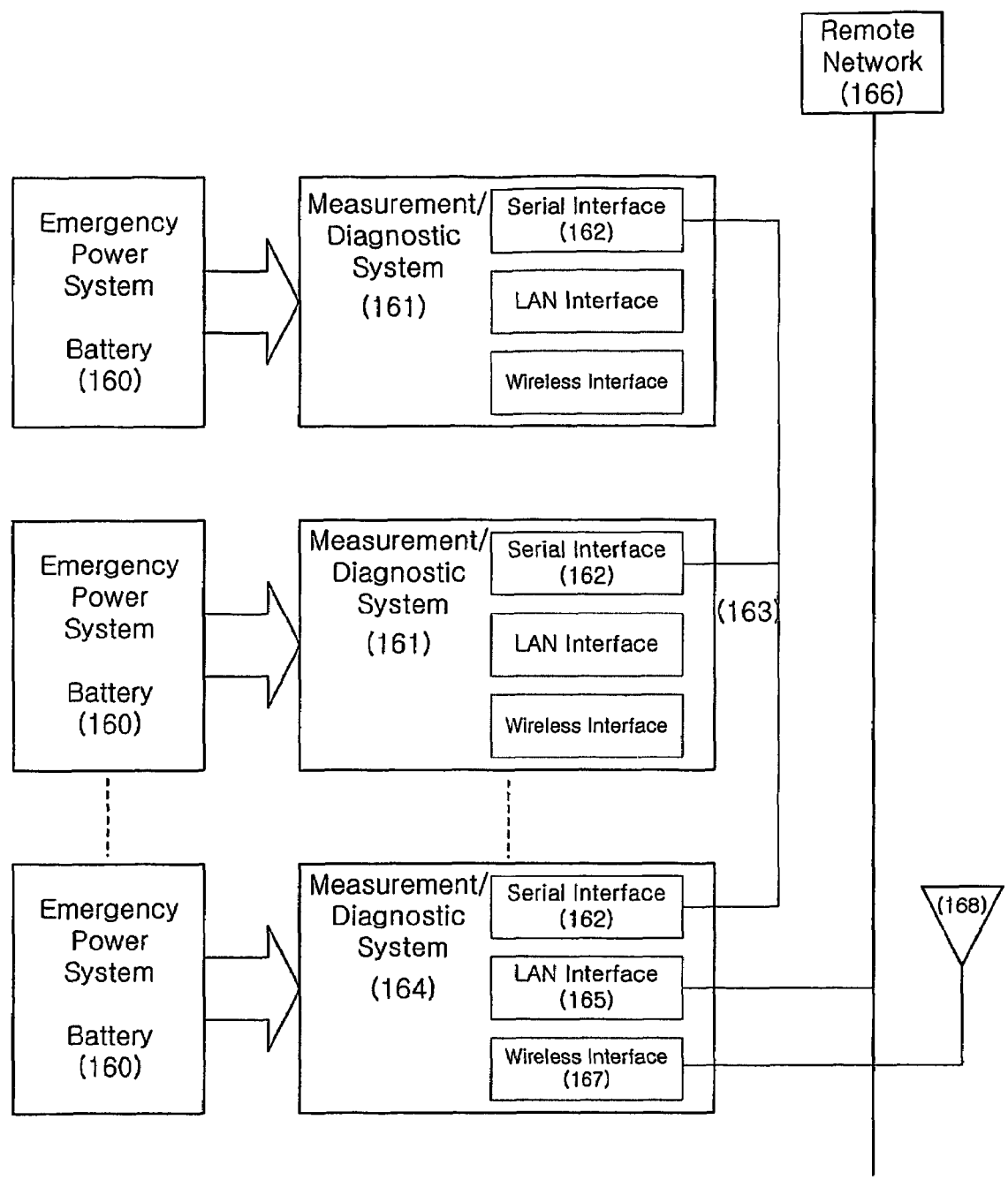

[Fig 16]
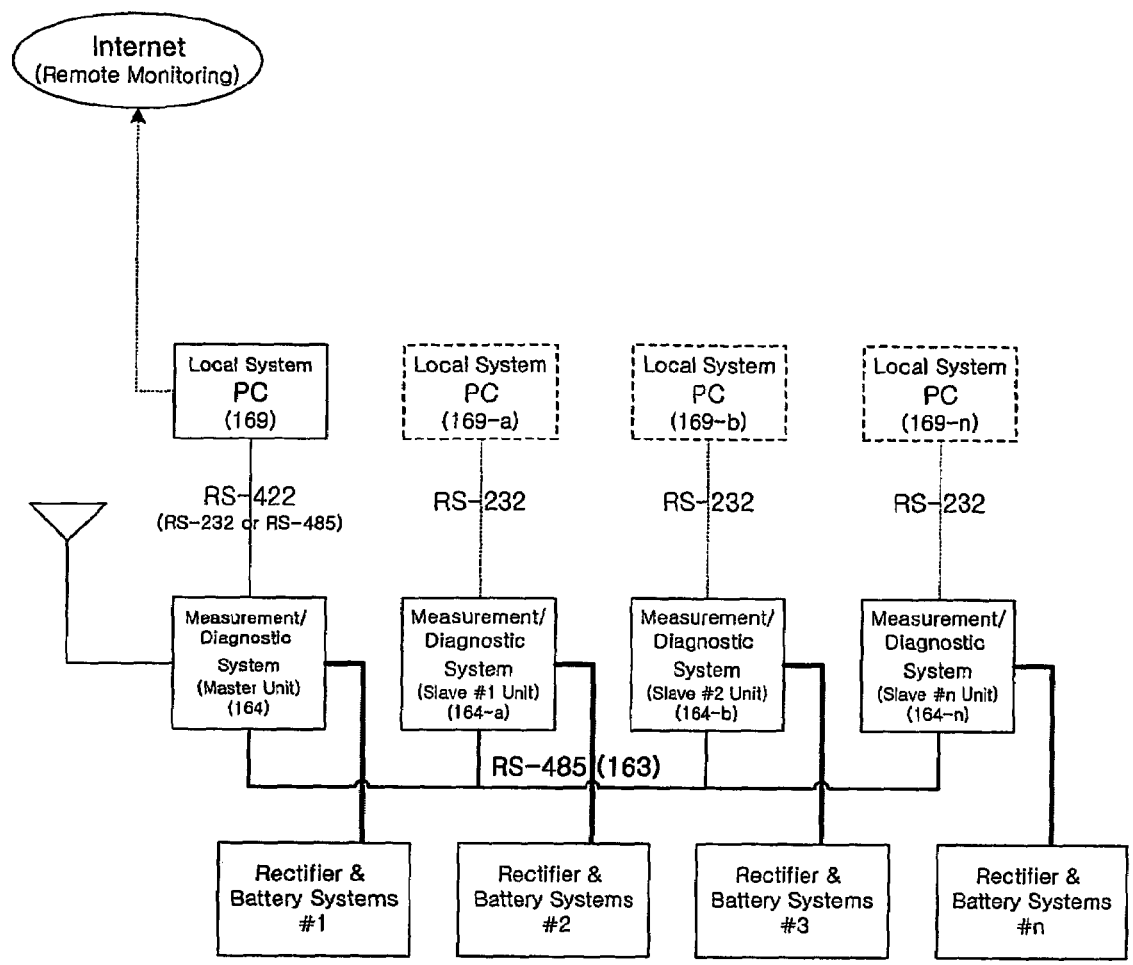

[Fig 17]
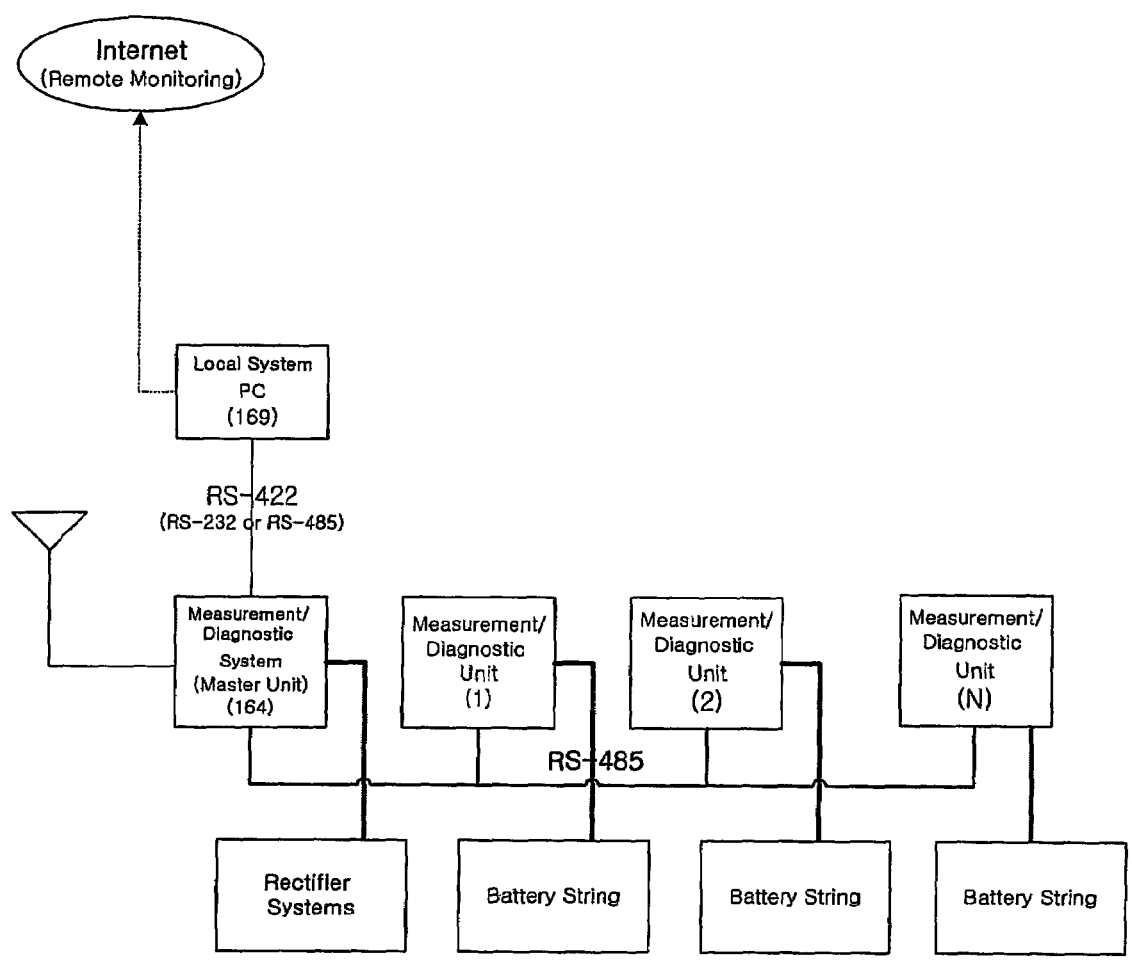

DIAGNOSIS FOR EXPECTED LIFE OF EMERGENCY POWER APPARATUS

TECHNICAL FIELD

As storage batteries are generally used in emergency power of communication network power systems, it is very important to maintain these batteries effectively. The reliability of the emergency power system will be affected even if only one cell in a serially connected storage battery string fails in the system operation; therefore causing trouble in the stable operation of important devices such as communication system.

Generally, the equivalent electrical circuit of an alternating current storage battery cell is a serial network with resistance, inductance and capacitance (R-L-C). In thesis of IEEE 1188-1996, it is recommended to only measure the most influential factor R in diagnosing the aging status of hermetically sealed storage batteries.

Generally, to grasp the aging status of the material to be measured such as storage batteries of which the internal impedance increases in proportion to the aging status, the condition of healthiness is analyzed by flowing the AC constant current (Is) on both terminals of storage batteries as in FIG. 1, and calculating the internal impedance from the voltage drop, (impedance voltage: Vis) caused by internal impedance.

As is well known, when measured AC current flows on both terminals of hermetically sealed serial batteries, the wave shape of AC voltage between the battery terminals—the higher the frequency, the faster the voltage phase than current phase by L element—the lower the frequency, there is a tendency that current phase lags voltage phase by C element.

When the constant current of sinusoidal wave (AC constant current) is generated within the frequency bandwidth (60-1,000 Hz), corresponding to the resonant frequency point $f=1/(2\pi\sqrt{LC})$ where the phase almost meets and supplies to the storage battery cell, then the approximate effective impedance can be calculated by measuring the AC voltage induced by the internal impedance only excluding the inductance and capacitance elements. When the measured frequency is around 1 Khz, the interfacial resistance becomes small compared to the impedance by the capacitance element and it can be ignored, the circuits of a battery can becomes equivalent to electrolyte resistance and electrical double layer capacitor in series. The healthiness of the storage batteries can be measured by comparing phase difference between Ac voltage (Vis) and AC constant current (Is), generated only by the internal resistance of storage batteries, by supplying a constant current of AC sinusoidal waves around 1 Khz to the storage batteries as shown in FIG. 1 and by measuring the effective values of sinusoidal wave voltage induced on both terminals of the battery cells and the above AC constant current (Is) of sinusoidal waves.

This invention makes it possible to effectively manage the storage batteries by charging without separating the storage batteries from the operating system through devices such as a microprocessor capable of numerical operation and measuring the important parameters such as impedance of the battery cells, voltage across terminals and temperature in real time to find out the bad storage batteries and to generate the alarm signal when necessary.

Additionally, monitoring the output waveform of the quality of power by observing the state of break down or operation of the emergency power system (UPS, battery charger) at all times, the history about the measured healthiness of the storage batteries can be stored and managed in a daily or monthly data form. The history will be used to manage the emergency power system making use of wireless communication network or remote network systems.

BACKGROUND ART

The diagnosis system for storage battery aging status phenomena implemented up to this time is a system measuring the remaining capacity in a sample cell, by discharging the string of storage batteries in operation with full capacity or with necessary current, and by observing the voltage across the terminals as time changes. This method it is generally used in industries. The remaining capacity (life) of the storage batteries in the operating system can be diagnosed more accurately in comparison with the above method; but it is not suitable for finding out all the bad cells. A actual discharge method diagnoses the total remaining capacity of the storage battery string by grasping the capacity of only the minimum capacity unit cells among the battery string; therefore it is not suitable in finding all cells where the aging status is considerably progressed, and furthermore it requires a lot of manpower and expense to diagnose the aging status of the storage battery string in the charging state.

In order to check the healthiness of the storage batteries, the measuring instrument is commercialized to check the trouble of the storage batteries with the correlation of the terminal voltage and temperature while checking each cell by making use of the Lab View Program (Data analysis software) and Data Acquisition Card which are recently commercially sold, by measuring only the electrolyte temperature of each cell of the storage batteries and the voltage in floating charge and the charging current. With the above method the degree of progressed aging status can be grasped by comparing the terminal voltage of the unit cell in floating charge and the voltage of the cell in the same group of storage batteries in serial connection, but the variation of the terminal voltage is not small due to the amplitude of floating voltage and to the influence of the unit battery cell in serial or parallel connection, and there is no absolute correlation between the remaining capacity (aging status) and the terminal voltage in floating charge, the above method was thought doubtful about the reliability to adopt as a diagnosing method for the life or the healthiness of storage batteries.

The leading companies, YUASA in Japan and Polytronics in Canada, commercialized the instrument capable of measuring the internal impedance of storage batteries, since these instruments acquire the DC signal corresponding to the effective value of the internal impedance by synchronized waveform detection method with integrated semiconductor chip. When each string of the storage batteries which is in floating charge is manually measured, the internal impedance cannot be measured accurately because the AC voltage waveform is influenced by the charging ripple current. Furthermore, in case of analyzing the measured and stored data as a data base for systematic management of maintenance, the internal impedance is measured manually by moving the measuring lead to each terminal of the battery cells in floating charge. Therefore, there exists a risk of electric shock or a disadvantage of duplicated manpower and time to analyze the measured values. Additionally, the total data—surrounding temperature, gravity of electrolyte solution and charging current—necessary for diagnosis of aging status cannot be measured simultaneously. A few sample impedance measurements are easy but there is a great difficulty in accurate diagnosis of life from the simultaneous measurements of many cells.

The technology of "On-Line Battery Impedance Measurement"—U.S. Pat. No. 5,281,920, invented by John W. Wurst and et al on Jan. 25, 1994—was developed to diagnose the life of storage batteries, but the implementation method is completely different. This patent is composed of a voltage measurement module connected to a group of relay assemblies controlled by a system load controller, current measurement system and MPU. Impedance value is calculated by the decreasing speed value of the terminal voltage of the storage batteries discharged during 0.5 milli-sec and 20 milli-sec.

BRIEF DESCRIPTIONS OF DRAWINGS

FIG. 1 is as known, conceptual block diagram of internal impedance measurement for the diagnosis of aging status of storage batteries FIG. 2 is an operation block diagram based on the microprocessor for this invention FIG. 3 is an organization block diagram of each module of aging status diagnostic system of this invention FIG. 4 is a functional block diagram of this invention FIG. 5 is a conceptual block diagram of data acquisition process and measurement time of this invention FIG. 6 is an example of operation of a parallel connected group of relaying circuits FIG. 7 is a functionally connected block diagram between MCU and a group of relaying circuits of this invention FIG. 8 is a block diagram of constant current circuit of this invention FIG. 9 is an example of operation in detail of B class amplification circuit of this invention FIG. 10 is another example of operation in detail of B class amplification circuits of this invention FIG. 11 is an organization block diagram of automatic scaling circuits of this invention FIG. 12 is a time chart of the timer interrupt program FIG. 13 is a flow chart of the main program of an operational example of this invention FIG. 14 is a connection block diagram of zero crossing circuit of constant current (Is) and impedance voltage (Vis)

FIG. 15 is a conceptual block diagram of wired/wireless communication of aging status measurement/diagnostic system of this invention FIG. 16 is an operational example of wired/wireless communication of aging status measurement/diagnostic system of this invention FIG. 17 is a mutual communication block diagram between the diagnostic system and each diagnostic unit.

DETAILED DESCRIPTION

Technical Problem

This invention analyzes the healthiness and the remaining capacity of the storage batteries, and diagnoses the remaining life by operating hundreds of parallel/serially connected storage battery cells in the state of real time, and finding out the correlated factors with the storage battery condition by measuring the voltage, charging/discharging current, internal temperature, internal impedance and gravity of electrolyte solution of storage batteries. To ensure the reliability of uninterruptible power supply (UPS) or the power system of wired/wireless communication systems, this invention holds the function of always monitoring the operation status of emergency power systems such as UPS by monitoring the built-in storage batteries.

FIG. 2 shows the working flow concept based on the microprocessor to diagnose the healthiness of the emergency power system and the functional structure of the system. To explain the structure and how it works in this invention, the terminal voltage (V), current (I) and temperature (t) are measured by inputting particular data such as terminal voltage, current and temperature of storage batteries to be diagnosed into MPU in accordance with the predetermined sequence from voltage, current sensor and thermistor sensor shown in FIG. 2. After AC constant current (Is) is supplied to start the constant current source by ON/OFF command from MPU, the internal impedance of the storage batteries is calculated by the programmed algorithm in MPU from the constant current (Is) and AC impedance voltage (Vis) at battery terminals which is generated by the internal impedance of the storage batteries. For the measurement of many battery cells, many groups of relaying circuits are prepared to generate the signal to select a storage battery cell to be measured by MPU. Each datum of storage batteries is connected to MPU input through a corresponding relay of a selected group of relay assemblies and the constant current for the measurement of internal impedance is supplied to storage batteries through the relay in group of relaying circuits.

MPU commands these kinds of controls, and the information data acquired from these controls are stored in the internal memory equipped in the measurement/diagnostic system. Based on these data, the aging status of the storage batteries is diagnosed with the activation of the aging status diagnostic algorithm in MPU.

Keypad input and LCD are used as user's interface. If something abnormal occurs in the output waveform of emergency power supply or in storage batteries, the quality of the emergency power system and storage batteries is effectively managed to generate the necessary information and alarm on the LCD screen of the measurement/diagnostic system. The acquired data are stored as a history; these data can be transmitted to an outside host PC via communication device such as serial communication. In case that the host PC is located far away or hard to approach from the managing place like the wired/wireless communication network relay station, the data can be transmitted via remote communication network or wireless communication network. A local PC or remote host computer acquires and analyzes the transmitted data. Conclusively, it is possible to understand the state of the storage batteries and to make graphs or charts as a data base. The reliability of the power system can be improved when the data are managed in real time for further reference. Moreover, it is advantageous from a management perspective as it is more cost effective.

Technical Solution

This invention has the function of aging status diagnosis (quality monitoring) of emergency power systems and suggests how to manage this emergency power system at remote sites through the general communication network. The detailed explanation is given through an operational example.

FIG. 3 shows the basic block diagram of the diagnostic system structure capable of diagnosing the basic unit (generally consists of 12 cells, 24 cells or 56 cells) of storage batteries. MPU (1) is a central processing unit which controls and manages the total system, and stores the historical data of each storage battery cell in the memory element. Each cell of the storage batteries is connected to the group of relaying circuits and the contacts of each relay are connected to the corresponding +/− terminals of each storage battery cell through 4-terminal circuit network. The select signal by MPU (1) is applied to the input terminals of the group of relaying circuits to excite the relay coil connected to the storage batteries to be measured. Then, the selected relay assembly of the No. 1 through No. N relay assemblies operates. Simultaneously (after a few milli-seconds) to start the constant current source (5), a clock pulse (CLK) of tens of KHz signal is applied to the constant current circuit, and constant current flows into the storage batteries.

The data signals of voltage (V), temperature (t), impedance (Z) and gravity (G) of the storage batteries are transduced to the readable values by MPU (1) from the automatic scaling circuit (7) and A/D converter (6), and applied to the input terminals of MPU (1). The historical status data of the storage battery cells is computed by the MPU (1) utilizing the stored data by the aging status diagnosis program installed in MPU (1), and the results are stored in the memory element (2) displayed on LCD and transmitted externally through communication method (8) such as RS232, RS422, RS485 and CDMA if necessary. Where the group of relaying circuits is not necessary, in case of diagnosing a few storage battery cells, the output terminals of 4-terminal circuit network are directly connected to the terminals of storage battery cells.

FIG. 4 shows the hardware structure of the diagnostic system of functional block connection. The structure consists of main controller unit (11) expressed as MCU, auxiliary power supply (10), AC constant current circuit (5), group of relaying circuits (4), AC sensor circuit (15) and DC sensor circuit (14) and etc. The main controller unit (11), as referred above, consists of:

MPU (1), memory element (2), and automatic scaling circuit (7) which properly selects and amplifies each characteristic data of storage batteries from relaying circuit, the preamplifier (16) to amplify the quality information data of emergency power system, A/D converter (6) to transduce the data signal, and the communication port such as RS232, RS422, RS485 and CDMA module.

The necessary control power for operation of the hardware is supplied from the auxiliary power supply (10).

Constant current circuit (5) plays the role of supplying constant current of fixed amplitude to generate voltage by the impedance of storage batteries. The group of relaying circuits (4) selects one storage battery cell among the many storage batteries by the select control signal generated by MPU (1) in the main controller unit (11), and MPU (1) supplies rectangular waveform clock (CLK) signals to start the constant current circuit (5). The Constant current circuit (5) receives the clock signal and transforms it to generate AC constant current of sinusoidal waveform, and the constant current (Is) is supplied to the selected storage battery cell by the relay in the group of relaying circuits. In the operational example of this invention, the sinusoidal wave generator is composed of a digital counter. When tens of KHz clock pulse (CLK) signal is applied, the applied clock pulse is transformed to generate the frequency of a constant current source (5) and activates the constant current source. When the constant current source (5) is composed of R-C or a crystal oscillator, the constant current source (5) starts to run by an ON/OFF start signal applied by MPU (1). When the measurement of the characteristic data of selected storage battery cells is done, MPU (1) stops supplying 16 KHz clock signal to stop the operation of the constant current source (5) and immediately cuts off the corresponding relay. When MPU (1) controls the start of the constant current source (5) and the ON/OFF relay in accordance with the operating sequence as in the above, the contacts are not damaged and the life of contacts can be extended as they are picked up and released without current flow at the contact points.

As illustrated above, to ensure the reliability of UPS for computers, the power source of wired/wireless communication network (rectifier) and string of storage batteries used in this system in monitoring the string of storage batteries, it is necessary to monitor the operation condition of emergency power systems such as UPS in order to supply AC power without power interruption to communication facilities or computers.

For this, the main controller unit (11):

collects the characteristic data of each storage battery cell through the group of relaying circuits, diagnoses the state of storage batteries, monitors the AC output voltage/current of emergency power system (18), charging/discharging voltage (DCV) and current (DCA) from the disclosed AC sensor circuit (15) and DC sensor circuit (14), and records them at all times.

To describe in more detail, to monitor the power quality of the power system, the main controller unit measures and analyzes the 3-phase voltage (AC voltage) and 3-phase current (AC current), and stores the RMS values of each phase in steady state and RMS values of each phase and real time waveform at power failure, not including the time to check the storage battery characteristics. In addition, the stored data are transmitted to the host computer at a certain time, and the transmitting time can be understood by the real time clock timer (RTC) built in, and records the power failure time. When the value of the acquired data exceeds the limit value through transient voltage sag or power failure, it accomplishes the function of transmitting the event to the host PC via communication port.

As the internal impedance voltage of storage battery cells is very low, under 1 mV, it is influenced by the measured value of the above signal voltage by the transmission line voltage drop of the measuring circuit and the ripple current in charging. Therefore, to reduce the influence of the contact resistance of the terminals (line resistance of lead and contact resistance of plug), the disclosed 4-terminal measurement method is used. AC current (Is) is supplied to storage battery cells from the terminals of the constant current circuit and the voltage drop of internal impedance of storage batteries is connected to the high impedance circuit in the pre-amplifier (16) as shown in FIG. 4. There is no voltage drop incurred by flowing almost no current from line resistance of lead and contact resistance of terminals. With this measurement method, it is made so that the contact resistance has almost no influence by minimizing the voltage drop due to line resistance and contact resistance. Additionally, to compensate the measured error of the offset values of pre-amplifier (16) and automatic scaling circuit (7), and measured error of line resistance and contact resistance, Analog to digital (A/D) output value can be calibrated to zero when the input signal indicates zero by contacting the output lead terminals together before the measurement of impedance, and this measured value can be chosen to be calibrated in measuring the actual values.

The terminal voltage waveform (AC actual voltage ($V_{SM}$)) measured at storage battery cell through the group of relaying circuits (4) is a very small signal of a few mV, and very small (one per a few thousand) compared with the terminal voltage of a storage battery cell, and it contains much electromagnetic noise. It is necessary to amplify only the AC voltage (Vis) picked up by an optimally designed pre-amplifier (16). As the ripple current flows into the storage batteries at floating charge, the terminal voltage waveform of the storage batteries has much harmonics of ripple voltage. Among the above ripple voltage frequencies, the content of harmonics differs by the number of rectification pulses. It has a ripple frequency of an odd number times the frequency (60 Hz) of the commercial power source. For example, in case of 3-phase rectification method, when the frequency of AC constant current (Is) applied to the storage batteries is 1 KHz, approximately 900 Hz ($15^{th}$ harmonic), 1020 Hz ($17^{th}$ harmonic), 1140 Hz ($19^{th}$ harmonic) mainly influence the measurement values. That is, the measured signal voltage waveform, with the impedance AC voltage (Vis) mixed with a multiple of the harmonic ripple voltage, flown into MPU (1) input terminals has a configuration of oscillating with a constant period.

The ripple voltage with many harmonics has a different constant period (Trp). This kind of ripple voltage contains ripples of multiple orders, although most of the ripples can be removed by the band pass filter in the pre-amplifier (16). The ripple voltage noise similar to impedance voltage necessary for measurement cannot be filtered and passes with the impedance voltage (Vis) signal, causing a serious influence on impedance measurement value.

Advantageous Effect

This invention, as in the operational examples, measures the exact value of impedance voltage induced by the AC current (Is) supplied by a constant current source from AC actual voltage ($V_{SM}$) signal which contains noisy ripple voltage. Based on this, it suggests detailed procedure of hardware organization, operational algorithm and program execution capable of acquiring the effective value (resistance) of internal impedance. Therefore, making use of this invention, operating in the state of floating charge, the aging status can be diagnosed by accurately measuring the internal impedance of storage batteries and DC electrolytic capacitor. Even if noise comes in together with input signal in case of medical diagnosis for edematous parts, the measurement signal can be separately filtered from the noise signal.

As a series of each functional operation and the program in MPU (1) is executed, this diagnostic system always monitors and controls the healthiness of the emergency power system such as storage batteries in real time, finds out the cause of the aging status progressed before an accident, and treats it properly. As software and user's menu for computer can be configured, stable secondary preparatory power can be supplied to cutting edge devices even in power failures, and the reliability of the high-tech system can be assured. Through economic maintenance, the emergency power supply system can be reasonably managed.

The Best Mode for the Execution of this Invention

As illustrated above, high frequency ripple voltage ($V_{RP}$) by charging current and impedance voltage (Vis) by AC constant current (Is) are mixed in AC actual voltage signal ($V_{SM}$) acquired from the terminals of battery cells in the state of floating charge. In the patent application number 10-2003-0028521 in Korea (Measuring method of effective voltage value of very small signal contained in noisy ripple), the technology for accurately acquiring very small voltage signals (impedance voltage, Vis) generated by the internal impedance from AC actual voltage ($V_{SM}$) in which the above ripple voltage ($V_{RP}$) is mixed is concretely suggested.

Let the fundamental frequency of commercial power source for the floating charge of a battery be ωs, the frequency of constant current (Is) supplied to battery cell, as an example, to measure the internal impedance is determined as S times ωs. As the impedance voltage is generated by constant current (Is), the frequency also becomes $S^{th}$ order times frequency. The noise rejection circuit like the above band pass filter is designed to pass the signal corresponding only with the $S^{th}$ order frequency. The noise rejection circuit like an ideal narrow-band filter passes only the signal near $S^{th}$ order frequency accurately set up as bandpass frequency, but in reality this kind of noise rejection circuit is very hard to implement, and the implementation causes an increase in cost.

That is, the filtering is not perfect as general band pass filter circuit attenuates only 30% of waves with frequency adjacent to low band cutoff frequency ($f_L$) or high band cutoff frequency ($f_H$). For example, the narrow-band filter is designed to make the resonant frequency ($f_R$) equal to $S^{th}$ order harmonics, low-band cutoff frequency almost equal to $(S-2)^{th}$ order harmonics and high-band cutoff frequency almost equal to $(S+2)^{th}$ order harmonics, and the signal beyond these frequencies is filtered and attenuated. As an operational example, the harmonics ripple voltage ($V_{RP}$) of a battery in floating charge mostly has only the ripple frequency element corresponding to one of the odd number times or even number times the fundamental frequency of commercial power source: 50/60 Hz. In the above high frequency ripple voltage ($V_{RP}$), impedance voltage (Vis) generated by the said constant current (Is) and the harmonics with similar order frequency of odd number or even number come out after passing the noise rejection circuit, and the other harmonics are almost attenuated (removed).

Therefore, the harmonics ripple voltage ($V_{RP,FLT}$) is expressed as $$V(t)_{RP,FLT} = K_{S-2} \cdot f((S-2) \cdot w_S t) + K_S \cdot f(S \cdot w_S t) + K_{S+2} \cdot f((S+2) \cdot w_S t) \quad \text{Eq. (1)}$$

Where, $$f(S \cdot w_S t) = \cos(S \cdot w_S t)$$

and K is the amplitude of $X^{th}$ order ripple voltage, and S is an integral number because each harmonics is higher than the $2^{nd}$ order. When S=1, (S−2) is a negative (−) integer with a special condition and K consists of only fundamental and $3^{rd}$ harmonics. First of all, as an operational example, if the amplitude of the impedance generated by the constant current (Is) with $S^{th}$ order frequency is K, $$V(t)_{IS} = K \cdot f(S \cdot w_S t) \quad \text{Eq. (2)}$$

Additionally, the AC actual voltage ($V_{SM}$) mixed with harmonics ripple voltage ($V_{RP,FLT}$) after passing the above noise rejection circuit and impedance voltage (Vis) is expressed as a sum of Eq. (1) and Eq. (2).

$$V_{SM}(t) = K_{S-2} \cdot f((S-2) \cdot w_S t) + K_S \cdot f(S \cdot w_S t) + K_{S+2} \cdot f((S+2) \cdot w_S t) + K \cdot f(S \cdot w_S t) \quad \text{Eq. (3)}$$

The definition of the root mean square (RMS) value (S) of a function X(t) which has optional multiple (Ts=1×Tsyn, 1: integer) of one period (Tsyn) is equal to Eq. (4)

$$S = \sqrt{\frac{1}{T_S} \int_0^{T_S} X^2(t)\, dt} \quad \text{Eq. (4)}$$

The RMS value of the said AC actual voltage ($V_{SM,RMS}$) can be derived from Eq. (3) and Eq. (4) as, RMS value:

$$V_{SM,RMS} = \sqrt{\frac{1}{T_{SM}} \int_0^{T_{SM}} V_{SM}^2(t)\, dt}$$

And therefore as, $$= \sqrt{\frac{1}{T_{SM}} \cdot \int_0^{T_{SM}} \{K_{S-2} \cdot f((S-2) \cdot w_S t) + (K_S + K) \cdot f(S \cdot w_S t) + K_{S+2} \cdot f((S+2) \cdot w_S t)\}^2 dt}$$

$$= \left[ \frac{1}{T_{SM}} \cdot \int_0^{T_{SM}} \{K_{S-2} \cdot f((S-2) \cdot w_S t)\}^2 dt + \frac{1}{T_{SM}} \cdot \int_0^{T_{SM}} \{(K_S + K) \cdot f(S \cdot w_S t)\}^2 dt + \frac{1}{T_{SM}} \cdot \int_0^{T_{SM}} \{K_{S+2} \cdot f((S+2) \cdot w_S t)\}^2 dt + \frac{1}{T_{SM}} \cdot \int_0^{T_{SM}} 2 \cdot K_{S-2} \cdot (K_S + K) \cdot f((S-2) \cdot w_S t) \cdot f(S \cdot w_S t) dt + \frac{1}{T_{SM}} \cdot \int_0^{T_{SM}} 2 \cdot (K_S + K) \cdot K_{S+2} \cdot f(S \cdot w_S t) \cdot f((S+2) \cdot w_S t) dt + \frac{1}{T_{SM}} \cdot \int_0^{T_{SM}} 2 \cdot K_{S-2} \cdot K_{S+2} \cdot f((S-2) \cdot w_S t) \cdot f((S+2) \cdot w_S t) dt \right]^{\frac{1}{2}}$$

Eq. (5)

$$2 \cdot \cos A \cdot \cos B = \cos(A+B) + \cos(A-B) \qquad \text{Eq. (6)}$$

$$\cos(-C) = \cos(C) \qquad \text{Eq. (7)}$$

As in the above $$f(S \cdot w_S t) = \cos(S \cdot w_S t)$$

When making use of the known trigonometric function to Eq. (6) and Eq. (7), the multiplication term composed of multiplication of mutually different terms on the right side in Eq. (5) can be replaced as follows $$\frac{1}{T_{SM}} \int_0^{T_{SM}} 2 \cdot K_{S-2} \cdot (K_S + K) \cdot f((S-2) \cdot w_S t) \cdot f(S \cdot w_S t) dt = \frac{K_{S-2} \cdot (K_S + K)}{T_{SM}} \cdot \left\{ \int_0^{T_{SM}} f(2 \cdot (S-1) \cdot w_S t) dt + \int_0^{T_{SM}} f(2 \cdot w_S t) dt \right\}$$

Eq. (8)

-continued $$\frac{1}{T_{SM}} \cdot \int_0^{T_{SM}} 2 \cdot (K_S + K) \cdot K_{S+2} \cdot f(S \cdot w_S t) \cdot f((S+2) \cdot w_S t) dt = \frac{(K_S + K) \cdot K_{S+2}}{T_{SM}} \cdot \left\{ \int_0^{T_{SM}} f(2 \cdot (S+1) \cdot w_S t) dt + \int_0^{T_{SM}} f(2 \cdot w_S t) dt \right\}$$

Eq. (9)

$$\frac{1}{T_{SM}} \cdot \int_0^{T_{SM}} 2 \cdot K_{S-2} \cdot K_{S+2} \cdot f((S-2) \cdot w_S t) \cdot f((S+2) \cdot w_S t) dt = \frac{K_{S-2} \cdot K_{S+2}}{T_{SM}} \cdot \left\{ \int_0^{T_{SM}} f(2 \cdot S \cdot w_S t) dt + \int_0^{T_{SM}} f(4 \cdot w_S t) dt \right\}$$

Eq. (10)

Among the said equations of Eq. (8), Eq. (9) and Eq. (10):

$$f(2 \cdot (S-1) \cdot w_S t),\ f(2 \cdot w_S t),\ f(2 \cdot (S+1) \cdot w_S t),\ f(2 \cdot S \cdot w_S t),\ f(4 \cdot w_S t)$$

are even number harmonics such as 2(S−1) times, 2 times, 2(S+1) times, 2S times, 4 times the fundamental frequency ($\omega_S$) of commercial power source.

When the harmonics are integral number times the fundamental frequency as in the trigonometric function of Eq (11), the integration value over a period of fundamental frequency is zero as known, that is $$\int_0^{T_{WS}} \cos(m \cdot w_S t) dt = 0 \qquad \text{Eq. (11)}$$

$$T_{WS} = \frac{1}{f_{WS}} = \frac{2\pi}{w_S}$$

where m is an integer.

Eq. (8), Eq. (9) and Eq. (10) are expressed as integral number times $2\omega_S$, the integration value over the period corresponding to $2\omega_S$ (in general, the frequency of commercial power is 60/50 Hz which corresponds to approximately 376.99 rad/sec, period: 8.33 ms/10.0 ms) is zero. That is, Eq. (12) is a sufficient condition to make all the equations (8), (9) and (10) zero.

$$T_{SM} = \frac{1}{2f_s} = \frac{\pi}{w_s} \qquad \text{Eq. (12)}$$

Therefore, the RMS value ($V_{SM,RMS}$) of the AC actual voltage ($V_{SM}$) in Eq. (5) is $$V_{SM,RMS} = \left[ \frac{1}{T_{SM}} \cdot \int_0^{T_{SM}} \{K_{S-2} \cdot f((S-2) \cdot w_S t)\}^2 dt + \frac{1}{T_{SM}} \int_0^{T_{SM}} \{(K_S + K) \cdot f(S \cdot w_S t)\}^2 dt + \frac{1}{T_{SM}} \int_0^{T_{SM}} \{K_{S+2} \cdot f((S+2) \cdot w_S t)\}^2 dt \right]^{\frac{1}{2}}$$

Eq. (13)

Where $T_{SM}$ can be expressed as follows $$T_{SM} = \frac{1}{2f_s} = \frac{\pi}{w_s}$$

On the other hand, to express the RMS value of the harmonics ripple voltage ($V_{RP,FLT}$), after passing the noise rejection circuit, like Eq. (1) and Eq. (4)

$$\sqrt{\frac{1}{T_{RF}} \cdot \int_0^{T_{RF}} V(t)_{RF,FLT}^2 dt} = \sqrt{\frac{1}{T_{RF}} \cdot \int_0^{T_{RF}} [K_{S-2} \cdot f((S-2) \cdot w_S t) + K_S \cdot f(S \cdot w_S t) + K_{S+2} \cdot f((S+2) \cdot w_S t)]^2 dt}$$

$$= \left[ \frac{1}{T_{RF}} \cdot \int_0^{T_{RF}} \{K_{S-2} \cdot f((S-2) \cdot w_S t)\}^2 dt + \frac{1}{T_{RF}} \cdot \int_0^{T_{RF}} \{K_S \cdot f(S \cdot w_S t)\}^2 dt + \frac{1}{T_{RF}} \cdot \int_0^{T_{RF}} \{K_{S+2} \cdot f((S+2) \cdot w_S t)\}^2 dt + \frac{1}{T_{RF}} \cdot \int_0^{T_{RF}} 2 \cdot K_{S-2} \cdot K_S \cdot f((S-2) \cdot w_S t) \cdot f(S \cdot w_S t) dt + \frac{1}{T_{RF}} \cdot \int_0^{T_{RF}} 2 \cdot K_S \cdot K_{S+2} \cdot f(S \cdot w_S t) \cdot f((S+2) \cdot w_S t) dt + \frac{1}{T_{RF}} \cdot \int_0^{T_{RF}} 2 \cdot K_{S-2} \cdot K_{S+2} \cdot f((S-2) \cdot w_S t) \cdot f((S+2) \cdot w_S t) dt \right]^{\frac{1}{2}}$$

Eq. (14)

When making use of the known trigonometric function theory like Eq. (6) and Eq. (7), the multiplication term on the left side in Eq. (14) becomes $$\frac{1}{T_{RF}} \cdot \int_0^{T_{RF}} 2 \cdot K_{S-2} \cdot K_S \cdot f((S-2) \cdot w_S t) \cdot f(S - w_S t) dt = \frac{K_{S-2} \cdot K_S}{T_{RF}} \cdot \left\{ \int_0^{T_{RF}} f(2 \cdot (S-1) \cdot w_S t) dt + \int_0^{T_{RF}} f(2 \cdot w_S t) dt \right\}$$

Eq. (15)

$$\frac{1}{T_{RF}} \cdot \int_0^{T_{RF}} 2 \cdot K_S \cdot K_{S+2} \cdot f(S \cdot w_S t) \cdot f((S+2) \cdot w_S t) dt = \frac{K_S \cdot K_{S+2}}{T_{RF}} \cdot \left\{ \int_0^{T_{RF}} f(2 \cdot (S+1) \cdot w_S t) dt + \int_0^{T_{RF}} f(2 \cdot w_S t) dt \right\}$$

Eq. (16)

$$\frac{1}{T_{RF}} \cdot \int_0^{T_{RF}} 2 \cdot K_{S-2} \cdot K_{S+2} \cdot f((S-2) \cdot w_S t) \cdot f((S+2) \cdot w_S t) dt = \frac{K_{S-2} \cdot K_{S+2}}{T_{RF}} \cdot \left\{ \int_0^{T_{RF}} f(2 \cdot S \cdot w_S t) dt + \int_0^{T_{RF}} f(4 \cdot w_S t) dt \right\}$$

Eq. (17)

Among the equations (15), (16) and (17)

f(2·(S−1)·w$_S$t), f(2·w$_S$t), f(2·(S+1)·w$_S$t), f(2·S·w$_S$t), f(4·w$_S$t)

are harmonics of 2(S−1) times, 2 times, 2(S+1) times, 2S times, and 4 times the fundamental frequency (ωs) of commercial power. As illustrated earlier, by the same principle, as the equations (15), (16) and (17) are expressed integral number times 2ωs, and the integration value over the period corresponding to 2ωs, and the sufficient condition for this is Eq. (18)

$$T_{RF} = \frac{1}{2f_s} = \frac{\pi}{w_s}$$

Eq. (18)

Therefore the RMS value ($V_{RP,RMS}$) of the harmonics ripple voltage ($V_{RP,FLT}$), after passing noise rejection circuit, is expressed as follows $$V_{RP,RMS} = \left[ \frac{1}{T_{RF}} \cdot \int_0^{T_{RF}} \{K_{S-2} \cdot f((S-2) \cdot w_S t)\}^2 dt + \frac{1}{T_{RF}} \int_0^{T_{RF}} \{K_S \cdot f(S \cdot w_S t)\}^2 dt + \frac{1}{T_{RF}} \cdot \int_0^{T_{RF}} \{K_{S+2} \cdot f((S+2) \cdot w_S t)\}^2 dt \right]^{\frac{1}{2}}$$

Eq. (19)

Where $$T_{RF} = \frac{1}{2f_s} = \frac{\pi}{w_s}$$

$T_{SM}$ in Eq. (13) and $T_{RF}$ in Eq. (19) are same values of period, and can be expressed as follows $$T_D = T_{SM} = T_{RF} = \frac{1}{2f_s} = \frac{\pi}{w_s}$$

Eq. (20)

In the mean time, the RMS value ($V_{IS,RMS}$) of impedance voltage (Vis) generated by constant current (Is) with $S^{th}$ order frequency, from Eq. (2) and Eq. (4), is expressed as follows $$V_{IS,RMS} = \sqrt{\frac{1}{T_{IS}} \cdot \int_0^{T_{IS}} V(t)_{IS}^2 dt} = \sqrt{\frac{1}{T_{IS}} \cdot \int_0^{T_{IS}} \{K \cdot f(S \cdot w_S t)\}^2 dt}$$

Eq. (21)

where, $T_{IS}$ can be defined as optional integral number times one period as shown in Eq. (4), and is set up as the same value of Eq. (20), and can be expressed as in Eq. (22).

$$T_D = T_{SM} = T_{RF} = T_{IS} = \frac{1}{2f_s} = \frac{\pi}{w_s} \quad \text{Eq. (22)}$$

Therefore the RMS value ($V_{IS,RMS}$) of the above impedance voltage (Vis) can be easily calculated, from Eq. (13) and Eq. (19), as follows $$\sqrt{V_{SM,RMS}^2 - V_{RP,RMS}^2} = \sqrt{\frac{1}{T_D} \cdot \int_0^{T_D} K \cdot f(S \cdot w_s t) \, dt} = V_{IS,RMS} \quad \text{Eq. (23)}$$

where $$T_D = \frac{1}{2f_s} = \frac{\pi}{w_s},$$

That is, the RMS value ($V_{RP,RMS}$) of harmonics ripple voltage ($V_{RP,FLT}$) after passing the disclosed noise rejection circuit, is integrated over an integration interval ($T_D$) of half the fundamental frequency ($\omega s$) and the RMS value ($V_{SM,RMS}$) of AC actual voltage ($V_{SM}$) is integrated over the same integration interval ($T_D$). Squaring the above two RMS values, and calculating the difference of the said squared values, it will be known that the result of the equation corresponding to square root value of the difference equals to the same result of the RMS value ($V_{IS,RMS}$) of impedance voltage (Vis).

In more detail, with the integration interval ($T_D$) as half the fundamental frequency ($\omega s$), by calculating the RMS values of AC actual voltage ($V_{SM}$) and harmonics ripple voltage ($V_{RP,FLT}$), the multiplication terms in equations (8), (9), (10) and in equations (15), (16), (17) become all zero. By calculating the difference of the squared values of $V_{SM,RMS}$ and $V_{RP,RMS}$, it can be found out that the result is only the squared value of $V_{IS,RMS}$, and all other terms except $$\frac{1}{T_D} \cdot \int_0^{T_D} \{K \cdot f(S \cdot w_s t)\}^2 \, dt$$

are removed, and the exact RMS value ($V_{IS,RMS}$) of impedance voltage (Vis) is found out.

In the above, as an operational example, by selecting the frequency of AC constant current (Is) supplied to battery cells as S times the frequency ($\omega s$) of commercial power source, we can make it accord with the specific order frequency of harmonics ripple voltage ($V_{RP,FLT}$) induced by charging current of the battery. The method that easily obtains the RMS value of impedance voltage (Vis) has been explained in the following case where the harmonics ripple voltage ($V_{RP,FLT}$) consists of the frequency element of either only odd number multiple or only even number multiple of frequency ($\omega s$) of commercial power source.

Below is another operational example where the frequency of AC constant current (Is) does not accord with the harmonics of ripple voltage ($V_{RP,FLT}$). The frequency of AC constant current (Is) is chosen to be S times the fundamental angular frequency ($\omega s$) of commercial power, and the harmonic ripple voltage ($V_{RP,FLT}$) contains both odd number multiple and even number multiple of frequency ($\omega s$) of commercial power but only the $S^{th}$ order frequency ($S \times \omega s$) does not exist in harmonics ripple voltage ($V_{RP,FLT}$). As mentioned above, by the same concept, the harmonic ripple voltage after passing noise rejection circuit is expressed as follows.

$$V(t)_{RF,FLT} = K_{S-2} \cdot f((S-2) \cdot w_s t) + K_{S-1} \cdot f((S-1) \cdot w_s t) + K_{S+1} \cdot f((S+1) \cdot w_s t) + K_{S+2} \cdot f((S+2) \cdot w_s t) \quad \text{Eq. (24)}$$

Therefore, the harmonic elements in AC actual voltage ($V_{SM}$) consist of the elements generated by harmonic voltage: $f((S-2) \cdot w_s t)$, $f((S-1) \cdot w_s t)$, $f((S+1) \cdot w_s t)$, $f((S+2) \cdot w_s t)$ and an element by constant current (Is) supplied to the battery cell: $f(S \cdot w_s t)$. In the procedure of calculating the RMS value of AC actual voltage ($V_{SM,RMS}$), integration terms, like Eq. (8), Eq. (9) and Eq. (10), generated by mutual multiplication are derived.

In these terms, $$\frac{1}{T_{SM}} \cdot \int_0^{T_{SM}} 2 \cdot K_{S-2} \cdot K_{S-1} \cdot f((S-2) \cdot w_s t) \cdot f((S-1) \cdot w_s t) \, dt$$

and the element $$\frac{1}{T_{SM}} \cdot \int_0^{T_{SM}} 2 \cdot K_{S-1} \cdot K_S \cdot f((S-1) \cdot w_s t) \cdot f(S \cdot w_s t) \, dt$$

exist, and applying trigonometric function shown in Eq. (6) and Eq. (7) to these mutual multiplication terms, $$\frac{K_{S-2} \cdot K_{S-1}}{T_{SM}} \cdot \left\{ \int_0^{T_{SM}} f((2 \cdot S - 3) \cdot w_s t) \, dt + \int_0^{T_{SM}} f(w_s t) \, dt \right\}$$

and $$\frac{K_{S-1} \cdot K_S}{T_{SM}} \cdot \left\{ \int_0^{T_{SM}} f((2 \cdot S - 1) \cdot w_s t) \, dt + \int_0^{T_{SM}} f(w_s t) \, dt \right\}$$

are derived. and the integration value becomes zero when the integration interval is chosen to be the period of fundamental frequency ($\omega s$). That is, as in the above, when the harmonics ripple voltage ($V_{RP,FLT}$) contains every order harmonic element, or there exists only odd number or only even number order frequency, and when the frequency of constant current (Is) chosen as integral number order frequency different from that of the said harmonic ripple element, the integration interval for computing RMS value should be increased double compared with the case that the harmonics ripple voltage contains only odd number or only even number order frequency, because the AC actual voltage ($V_{RP,RMS}$) contains all the odd number order and even number order harmonics. The quantity of data for this calculation is also doubly increased double and more operation time is necessary. Of course, when the said ripple voltage contains all the odd or even number order harmonics, the same result can be obtained even when the frequency of constant current (Is) is chosen equal to any integral number order harmonics of ripple voltage.

As for another example for execution, the frequency of constant current (Is) supplied to battery cells is optionally chosen as an average value of mutually adjacent order harmonic frequencies (for example: the average of 13th and 14th is 13.5th order). The integration interval of RMS value should be 4 times increased and the quantity of data for this computing is also 4 times increased.

As we can see when we look into the operational procedure, all of the frequency elements are in AC actual time wave form ($V_{SM}$).

With frequencies of all the harmonics elements in AC actual voltage ($V_{SM}$), the $1^{st}$ greatest common measure (GCM) is calculated from the result of operation by mutual addition and subtraction with the frequencies. And with frequencies of all the harmonics elements in harmonics ripple voltage ($V_{RP,FLT}$), finding out the $2^{nd}$ GCM is the result of operation by mutual addition and subtraction with the frequencies. Finding out the $3^{rd}$ GCM from the said $1^{st}$ GCM and the $2^{nd}$ GCM, the exact RMS value ($V_{IS,RMS}$) of impedance voltage (Vis) can be obtained when the integration interval ($T_D$) is determined with integral number times the $3^{rd}$ GCM. It is desirable to determine the $3^{rd}$ GCM as the integration interval ($T_D$) in order to minimize the computation time for the RMS value of impedance voltage. And in order to minimize the integration interval ($T_D$), the GCM from the result of computation by mutual addition and subtraction with the frequencies of all the harmonics elements in AC actual voltage ($V_{SM}$) should be minimized. Hence, the frequency of constant current (Is) supplied to battery cell is selected same as the frequency of the order of specific harmonics composing ripple voltage ($V_{RP,FLT}$). When the order of harmonics composing ripple voltage ($V_{RP,FLT}$) consists of only one of the odd number or even number, the integration interval ($T_D$) can be chosen to be half the period of the commercial frequency when computing the RMS value of impedance voltage. Therefore, it is advantageous to reduce the operating time by selecting the frequency of AC constant current (Is) supplied to battery cells equal to a specific frequency of harmonics in ripple voltage.

A series of the above concept of abstracting procedure for RMS value can be applied to software programs for numerical operation systems such as the microprocessor. The operating procedures of each RMS value from AC actual voltage ($V_{SM}$), ripple voltage ($V_{RP,FLT}$) and impedance voltage (Vis) are shown below.

First of all, the state that AC constant current (Is) is not applied is shown in FIG. 5. The harmonic ripple voltage, generated by the charging current of the battery cells in floating charge after passing noise rejection circuit, is acquired at a fixed period in the $1^{st}$ section (P1). At the 1st acquisition time ($T_{1,RP}$), the already computed base value (Vo) is subtracted from the acquired instantaneous values of ripple voltage ($V_{RP,FLT}$) and then the result, squared as shown in ($V_{RP,FLT}-V_O)^2{}_1$, is put into preliminarily allocated memory M1. And after this, the ripple voltage ($V_{RP,FLT}$) at the 2nd acquisition time ($T_{2,RP}$) is acquired sequentially and the said subtracting and squaring operation is repeated. The operation result ($V_{RP,FLT}-V_O)^2{}_2$ is added to memory M1, where the squared value ($V_{RP,FLT}-V_O)^2{}_1$ is already stored, and then $$\sum_{i=1,2}(V_{RP,FLT}-V_O)_i^2$$

is stored in M1. After this, repeating the said overall operation at the acquisition time for a fixed periodic interval of a half or one full period of commercial power frequency, the result of computation, $$\sum_{i=1}^{n}(V_{RP,FLT}-V_O)_i^2,$$

is stored in M1. After a fixed time, the constant current source is started up and the constant current (Is) is supplied to the battery cell.

The instantaneous values of AC actual voltage ($V_{SM}$), mixed up with impedance voltage (Vis) and harmonics ripple voltage ($V_{RP,FLT}$) after passing noise rejection circuit, is acquired in the $2^{nd}$ section (P2). In a similar way, periodically acquiring the AC actual voltage ($V_{SM}$) at a fixed interval, the already computed base value (Vo) is subtracted from AC actual voltage ($V_{SM}$) at the 1st acquisition time ($T_{1,SM}$) and the squared value ($V_{SM}-V_O)^2{}_{1,SM}$ is stored in another memory M2. Acquiring the instantaneous value of AC actual voltage ($V_{SM}$) at the $2^{nd}$ acquisition time ($T_{2,SM}$) and subtracting the base value (Vo), and squaring, the result ($V_{SM}-V_O)^2{}_{2,SM}$ is added to M2, where the squared value ($V_{SM}-V_O)^2{}_{1,SM}$ is already stored, and storing this value in memory M2, then $$\sum_{i=1,2}(V_{SM}-V_O)_{i,SM}^2$$

is stored in M2. After this, repeating the operation at the acquisition time for a fixed periodic interval of a half or one full period of commercial power frequency, the result of computation $$\sum_{i=1}^{n}(V_{SM}-V_O)_{i,SM}^2$$

is stored in M2.

As another example of application, for our convenience, the above operational procedure can be applied by acquiring the AC actual voltage ($V_{SM}$), mixed with impedance voltage (Vis) generated by constant current (Is) and harmonics ripple voltage ($V_{RP,FLT}$), at a fixed periodic interval in the $1^{st}$ section (P1), and in the $2^{nd}$ section (P2), by acquiring the harmonics ripple voltage ($V_{RP,FLT}$), generated by charging battery cells in the state of floating charge, while the constant current is not applied.

When a series of the above steps are finished, and by squaring the ripple voltage ($V_{RP,FLT}$) after passing the noise rejection circuit, the operational result of integration over a fixed period $$\sum_{i=1}^{n}(V_{RP,FLT}-V_O)_i^2$$

is stored in memory M1. And in memory M2, by squaring actual AC voltage ($V_{SM}$), the integration result over a fixed period $$\sum_{i=1}^{n}(V_{SM}-V_O)_{i,SM}^2$$

is stored. By computing the difference between the said two values in memory M1 and M2, and doing a division operation of the difference in half or one full period of commercial power frequency, and computing the square root value ($\sqrt{\ }$) of the result, the accurate impedance voltage (Vis) can be obtained.

Mode for Invention

As an example of application for this invention, FIG. 6 shows the connection method of 4 groups of relaying circuits in parallel, and FIG. 7 shows the functional connection diagram of main controller unit and group of relaying circuits. As shown in FIG. 7, each group of relaying circuits (4) has 16 relay assemblies each, and each relay assembly has the relay assemblies for constant current supply (Xna), voltage sensing (Xnb), temperature sensing (Xnc) and gravity sensing (Xnd). To select a specific cell among many battery cells, the select control signal from MPU (1) shall be decoded. The relay assemblies in the corresponding group of relaying circuits are to be selected by the decoded signal as above, and the battery cell connected to the selected relay assembly or group is to be connected to the measurement circuit.

With example of application illustrated in FIG. 7, the operation procedure of select control signal used for selection of a specific cell among many cells is explained in detail as below.

Generally the batteries for industry are operated in the string composition of 12, 24, 36 or more than 48 cells, while, the batteries for telecom relay station are generally being operated in composition of 4 cells of 12 volt. Therefore, considering the convenience and economical aspect of the circuit, if the string of batteries consists of 4 cells or 6 cells of 12 volt, a simple circuit that can selectively control a maximum 7 or 15 relay assemblies with 3 bit or 4 bit select control signal, and as the application example herein, the circuits that can select 48 to maximum 60 relay assemblies with the select control signal consisting of 6 bit can be designed.

First, divide the 6 bit select control signal generated from MPU (1) into two kinds of parts. Put the 2 bit signal (00,01,10, or 11) into the input circuit terminals (G1,G2) of 4 bit decoder circuit (MUX). If the 2 bit signal is (00), nothing is selected. If the 2 bit signal is 01, 10, 11, one group among 3 groups of relaying circuits consisting of maximum 16 relay assemblies, i.e. master group (4-1), No. 1 slave circuit group (4-2) or No. 2 slave circuit group (4-3), will be selected. Next, the remaining 4 bit signal among above 6 bits select control signal is to be put into the input terminal (D0, D1, D2, D3) of decoder circuit (MUX).

Generally, a decoder circuit (MUX) with N inputs has the decoding function that selects one port among $2^N$ output ports from N input signals. At this application example, 16 output signals are generated as 4 bit input signals (D0~D3) are used. The output signal of the port selected by 4 bit input signal of the above decoder circuit (MUX) selects one relay assembly or group among 16 relay assemblies in group of relaying circuits that are already selected by the above 2 bit signal. The selected relay assembly or group can be driven by transistor amplifier (TR array) connected to the port of the output terminal.

As another application example, the said 2 bit signal (00, 01,10,11) is to be put into the input circuit terminal G1,G2 of the said decoder circuit (MUX) to select one among the 4 groups of relaying circuits. The remaining 4 bit BCD signal is put into the input terminal ($D_0$, $D_1$, $D_2$, $D_3$) to select and operate one among the 15 relay assemblies connected to the output port. The circuit can be designed to switch off all the relay assemblies in the groups of relaying circuits when a specific signal e.g. "0000" is applied. In this manner, the main control unit (11) can select a specific cell among the string of battery cells by operating one relay assembly among normally 48 relay assemblies (3 groups×16 each), maximum 60 relay assemblies (4 groups×15 each). As the master group (4-1) and each slave group (4-2, -3 or -4) circuits of the said groups of relaying circuits are of the same structure, those groups are easily and economically installed inside a small space in 3 or 4 stacks, which are connected with each other through a mother board.

It is already explained that the sinusoidal waveform AC constant current generated by current source circuit (5) supplies about 1 KHz sinusoidal waveform AC current by dividing the clock (CLK) generated by MPU in the main controller unit (11).

The proper amplitude of sinusoidal waveform AC constant current supplied from current source circuit (5) is of not less than ten mA in case of alkaline battery or manganese battery. In case of high capacity, several hundred Ah, lead-acid battery, the voltage signal waveform can be exactly picked up from ripple noise by putting as a large current as possible to induce a relatively high internal impedance voltage (Vis) as the internal resistance is below 1 mΩ.

As an application example, peak constant current of 1~2 Amps can be applied to get 0.5~1.0 mV voltage signal between each terminal of a battery with 0.5 mΩ internal impedance of resistance element.

As an example of an application of this invention, FIG. 8 shows the functional block diagram of constant current source circuit (5). Getting input of clock (CLK, e.g. 16 KHz) synchronized with the standard clock of MPU from MPU (1) in main controller unit, making insulation with photo coupler (30), dividing the basic operation clock from MPU, a perfect AC sinusoidal waveform with standard frequency (e.g. 1 KHz) is obtained by way of sinusoidal waveform generation circuit (33) capable of the disclosed amplitude control.

The standard clock (CLK) used for the sinusoidal waveform in the said AC constant current circuit (5), as stated above, is obtained by dividing the basic operation clock of MPU (1), and as the frequency of the sinusoidal waveform AC constant current (Is) is generated by dividing this again, the basic operation clock and the frequency of the said AC constant current (Is) are always synchronized. Therefore, by dividing the standard clock of MPU (1) when operating the characteristic data related to internal impedance, the periods of the sinusoidal waveform AC constant current (Is) and AC voltage (Vis) can be easily computed, and the phase difference can also be measured precisely.

The said constant current circuit source (5) has the function of controlling the output current by making feedback in order to generate constant current (Is). That is, after the feedback signal, the feedback value ($I_f$) of the output current, is insulated by way of a converter such as the current transformer (CT) and it is changed to DC feedback signal at the rectification filter circuit (42) composed of the disclosed operational amplifier. In the operational amplifier which has the function of differential amplification, finding out the difference between the output current and the set value (43) of constant current, amplifying the difference and through integration (buffer) circuit, the constant current circuit is controlled to make it possible to supply constant current by inputting the difference to the amplitude control terminal (10) of the sinusoidal waveform generation circuit (33). The difference of the said 2 signals can be amplified by inputting the said DC feedback signal, after it is inverted and amplified in the operational amplifier, and is added with the set value (43) of the constant current, to the non-inverted input terminal of the integration circuit (32). In addition, a circuit can be implemented for an operational amplifier to have the same function of an operational amplifier (31) and an integration circuit (32).

In order to improve the accuracy of the measurement without influencing the characteristics and healthiness of the batteries during measurement, it is necessary to quickly generate the stable current without overshooting to reduce the measuring time by supplying the maximum current within the range with no influence to the battery. To carry out this function, after the clock signal (CLK) generated during start of the constant current source in MPU (1) and synchronized with the standard clock of the said MPU is filtered, if it is integrated with the integration circuit composed of resistance (R), capacitance (C) and buffer circuit, the soft start signal (SS) which increases slowly from the initial stage by the RC time constant can be generated. If the soft start signal is connected to the output terminals of the operational amplifier (31) with the function of differential operation and the integration circuit (32) via diode, to start the constant current circuit (5) during the initial stage when the said standard clock signal (CLK) is generated, even though the output values of the operational amplifier with the function of differential operation and the integration circuit are generated and increased, as the soft start signal (SS) is smaller than the output values of the said operational amplifier and the integration circuit, the soft start signal (SS) is preferentially inputted to the amplitude control terminal (10) of the sinusoidal waveform generation circuit, it possibly reaches the steady state of the sinusoidal current waveform within such a short time of 10 ms. In order to improve the transient response of the sinusoidal AC waveform (signal), which is acquired from the sinusoidal waveform generation circuit by the said method, it is subtracted from the feedback value ($I_f$) of the instantaneous output current in the instantaneous value addition circuit (34) of actual value, and is inputted to the No. 1 B-class amplification circuit (35) and amplified.

FIG. 9 shows an example of 2 step B-class current amplification circuit of constant current source signal (Is). The said sinusoidal waveform AC current signal (Is) is amplified at No. 1 amplification circuit (35) without distortion at first, and is inputted to the primary part of high frequency signal transformer (T2) with the secondary part, which has 2 reverse connected isolated (insulated) windings.

As the internal impedance of the batteries is relatively high, when the constant current source of less than 1 Amps is needed, the constant current source circuit can be simply organized by connecting the output of the No. 1 amplifier to the output transformer. The said sinusoidal waveform signal (Is) is changed 180 degrees in phase at the output of the reverse connected secondary winding of the said transformer (T2), finally a sinusoidal waveform (sin ωt) and 180 degree reversed sinusoidal waveform (sin ωt+180 deg) are acquired at the secondary winding. The No. 1 amplification circuit consists of an operational amplifier (U3) and transistors (Q1, Q2).

As the output of the operational amplifier (U3) is connected to each base terminal of NPN transistor Q1 and PNP transistor Q2, and as the primary of control transformer (T2) is connected to the inter-connected common point of each emitter terminal, the said signal (Is) is amplified and comes out through control transformer (T2), and amplified output signal (the inter-connected common point of each emitter) is once again put into inverting (−) terminal of the operational amplifier (U3) so that it makes stabilized current amplification possible, even though the current amplitude ratio ($H_{fe}$) varies.

The No. 2 B-class amplification circuit consists of operational amplifier U9A, U9B and NPN transistors (Q3,Q4) and output transformer (TM1) and etc.

The said sinusoidal waveform and the signal reversed 180 degrees in phase pass the operational amplifier U9A, U9B of the No. 2 B-class amplification circuit respectively. Its output is secondly amplified by putting into the base terminal of each NPN transistor (Q3, Q4). The starting point and ending point of the primary winding of output transformer (TM1) are connected to the collector terminal (or drain terminal in case of N channel FET) of transistor (Q3,Q4). The outputs of the said U9A and U9B are finally put out after being amplified through output transformer (TM1) with center tap connected to the positive pole (+).

In the FIG. 9, the said transistors (Q3, Q4) are illustrated as bipolar type single NPN transistor, and the amplification level of the said No. 2 B-class amplification circuit can be upgraded or its characteristics can be improved by replacing with N channel FET transistor or by organizing the circuit with Darlington compound.

FIG. 10 is another application example of No. 2 B-class amplifier. Although the No. 2 B-class amplification circuit in the FIG. 9 and No. 10 has the advantage of higher efficiency than A-class amplification circuit, it has cross over distortion. To improve it, the bias voltage (0.6-0.7V) is put into the base input terminal of the said transistors (Q3,Q4) by dividing the +12 V control power with resistor R1 and variable resistor VR1. The sinusoidal waveform constant current output amplified in this manner is directly supplied to the batteries, being insulated by output transformer (TM1), as the constant current source through coupling capacitor (Cdc) for impedance measurement of batteries. The terminal voltage of battery cell and constant current source are not electrically interfered by the coupling capacitor (Cdc) The constant current (Is) for internal impedance measurement of battery cells can be produced by the said procedure. It can be controlled so that the rated current of a certain amplitude can flow, even though the internal impedance is low in the case of shorted load.

Battery terminal voltage ($V_{DC}$) and current source is not electrically interfered via coupling capacitor (Cdc).

As explained above, the amplitude of the AC constant current supplied by current source circuit (5) for the measurement of battery internal impedance is controlled to be uniform.

The amplitude of AC voltage signal by the battery internal impedance measured at the terminals of the battery cells varies a lot in proportion to the aging status or the capacity of battery. In case that the impedance AC voltage signal is amplified by one kind of amplifier, whose amplifying gain is fixed, if the measured voltage signal becomes small, the measurement accuracy (resolution) becomes low because the measured level of the signal puts into the input terminal of main controller unit (11) by low level.

If the measured voltage signal is high beyond input voltage range, the main controller unit (11) can be burnt or cause malfunction.

To solve this problem, the operational amplifier with proper amplifying gain is to be selected in accordance with the amplitude of AC voltage signal (Vis) by connecting several operational amplifiers (50) in parallel, whose amplifying gains are different from each other. The output of the said parallel connected amplifier is inputted to the signal selector like analog switch, and the amplifying gain is selected in accordance with the amplitude of the said AC voltage signal.

FIG. 11 is an application example, equipped with amplifiers (50) having 4 kinds of amplifying gains of ×1, ×5, ×10, ×50.

Below is the method to select the amplifier (50-1, 50-5, 50-10, 50-50) with proper amplifying gains in accordance with the amplitude of the measured AC voltage signal (Vis). For proper operation of the said operational amplifier, the input signal should be in a proper range, when the output signal amplified by the said amplifier is greater than the rated value of the operational voltage of the amplifier, it is a well known fact that the voltage signal cannot be amplified in proportion to the amplifying gain of the amplifier and the amplified signal is saturated (amplifier saturation) within the operational voltage. Therefore, to select the amplifier with proper amplifying gain, first, select the amplifier (50-50) with the greatest amplifying gain, and if the amplifier output signal is saturated because the input signal is too large, then the main controller unit (11) detects this amplifier saturation, then the main controller unit sequentially selects the amplifier with next small amplifying gain, the AC voltage signal (Vis) properly amplified is put into the input terminal of the controller unit (11). On the other hand, if the inputted voltage signal is too small, the amplified output signal becomes too small, then the main controller unit (11) detects this, and the main controller unit (11) sequentially selects the amplifier with next large amplifying gain. In this manner, the amplifier with proper amplifying gain is automatically obtained in impedance operation, and this is called "Automatic Scaling".

The fundamental data about the battery cells of emergency power system, operated by a series of theoretical concept, and the measured data to monitor the power quality of emergency power systems are stored in the internal memory by MPU in the main controller unit (11). MPU diagnoses the aging status and computes the RMS values of each phase of the emergency power system, computes the RMS values of each phase and actual voltage in case of power failure, transmits the stored data outside via communication port, discerns the transmission time by the real time clock timer (RTC) inside the system, records the failure time, and transmits the power failure information to a remote place or host computer. The characteristic data about battery cells such as the measured temperature of battery cells, voltage of battery cells, charging/discharging voltage, charging/discharging current, and the peculiar internal resistance of battery cells calculated on the basis of these data are displayed on external output devices such as LCD equipped in the emergency power monitoring and diagnostic system. Every kind of data and command are inputted by a keypad. The status of battery cells is understood by the aging status criterion algorithm program activated by the amplitude of the computed internal resistance of battery. The information about the failed cells can be displayed by sight (alarm lamp) or by sound (beep sound), and can be transmitted to a remote place. A series of these kinds of MPU operation is executed by the programmed software algorithm, and the detail is as follows.

The software algorithm in the above consists of main program and timer interrupt program. In the main program stage, the programs of low priority such as external input device and external output device management, communication and impedance computation of battery cells which do not require the strict restriction of execution time are implemented and executed. In the stage of timer interrupt program, as shown in FIG. 4, the control of current source circuit (5), the operation of the group of relaying circuits (4), acquisition of data of emergency power system measured by AC sensor circuit (15) and DC sensor circuit (14), acquisition of battery temperature for monitoring/diagnostic of emergency power system and voltage of battery cell, charging/discharging current and voltage, and acquisition of AC voltage caused by internal impedance of battery are to be operated and executed in a given time.

FIG. 12 shows the execution period and conceptual process of the main program and timer interrupt program. The main program is executed (120) and timer interrupt program is executed (121) periodically at a fixed time interval. When the execution of the interrupt program is completed, the program returns to the main program and is repeatedly executed.

For the reliable measurement of internal impedance of a battery cell, the current source circuit (5) generates the sinusoidal waveform constant current (Is) oscillating at high frequency of a few kHz. It was already illustrated that this generates the impedance voltage of same frequency. To acquire this high frequency impedance voltage waveform (Vis) without any loss in the timer interrupt program stage, at the sequence of executing the function of acquiring the program continuously executes (124) the function of acquiring impedance waveform even though the program is at the time point to return to the main program, and it does not return to the main program, even in the main program execution period as shown in FIG. 12. That is, in timer interrupt program at the sequence of acquiring AC input waveform, DC waveform, temperature of emergency power system, the program returns to the main program after acquiring this kind of information, and continues to execute the sequence of the program just prior to the corresponding sequence when the interrupt occurred. In timer interrupt program execution for the acquisition of impedance voltage waveform, in the acquisition of impedance waveform of high frequency, it does not return to main program and continuously executes timer interrupt program by acquiring impedance voltage waveform at a high speed to increase the efficiency of the data acquisition and at the same time to secure the continuity and no loss of data by periodically acquiring data to monitor emergency power system.

FIG. 13 shows the operational sequence of main program as an operational example. At MPU (1) in main control unit (11), when the power is ON, the power is supplied from auxiliary power supply (10), and the main program is executed. And through the initialization (131), after preparing for the inspection of emergency power system (18) and battery cell, MPU checks (132) whether the external device such as keypad is in. When external input occurs, if the inputted datum is a diagnostic parameter, the corresponding parameter is set up (134). If not, it will check (135) if it is the command for data transmission between diagnostic system and external system via communication port. If it is a command, the data transmission variable is set up (136). After checking if the data transmission variable is set up, if it is set up, data are transmitted (138), and confirm whether there remain more data to be transmitted (139). If all the data is transmitted, the data transmission variable is cleared (14). When the data quantity is too large, the data are transmitted at a fixed quantity but not in full, and it returns to the main loop to execute another program. After returning, it checks (141) if there is a demand for data transmission. If there is a demand, the data transmission variable is set up (142) and data are transmitted at the next main program execution. Check (143) if the internal impedance is computed on the basis of the measured data of battery cells acquired by timer interrupt. If internal impedance operational variable is set up, compute this with the operational program (144), store (145) the computed impedance, and clear (145) the set up of internal impedance operational variable. A series of the above procedures is repetitively executed.

As an example of this invention, the impedance operation routine (144) is acquired by the timer interrupt program in FIG. 12, and is executed on the basis of the stored internal impedance voltage (Vis) and the actual value of AC constant current (Is). More in detail, impedance operation routine (144) consists of period, average value or RMS value computation program stage, and phase difference, impedance computation stage. And to obtain the RMS value, the average values of the above AC voltage (Vis) and AC constant current (Is) should be obtained first.

As shown in FIG. 14, input AC voltage (Vis) and AC constant current (Is) with A/D converter, and each signal of AC voltage (Vis) and AC constant current (Is) is inputted into zero crossing detector circuit. The point where the signal changes from (−) to (+) is detected by zero crossing detector circuit. The $1^{st}$ zero crossing signal (ZCV1), the $2^{nd}$ zero crossing signal (ZCV2), the $3^{rd}$ zero crossing signal (ZCI1) and the $4^{th}$ zero crossing signal (ZCI2) are inputted to high speed timer/counter. And the high speed timer/counter outputs the $1^{st}$ voltage counter data (tv1), the 2nd voltage counter data (tv2), the $1^{st}$ current counter data (ti1) and the $2^{nd}$ current counter data (ti2) at the instant when the zero crossing signals (ZCV1, ZCV2, ZCI1 and ZCI2) are inputted. The period of AC voltage (Vis) Tv=tv2−tv1, and the period of AC current Ti=ti2−ti1 can be computed from the difference of counter data of AC voltage signal and AC current signal.

RMS values of AC voltage (Vis) and current (Is) can be computed by making use of the average values of AC voltage and current in one period and the stored real time values of AC voltage and current.

$$V_s = \sqrt{\frac{\sum (v(n) - V_{avg})^2}{N}}$$

$$I_s = \sqrt{\frac{\sum (i(n) - I_{avg})^2}{N}}$$

where V(n) means each real time value of stored AC voltage waveform, and i(n) means the actual value pf AC current waveform, and N is the stored number of real time values over the total period.

In the phase difference program, the phase difference (ø) between AC voltage (Vis) and AC current (Is), which is the difference between the $1^{st}$ zero crossing signal (ZCV1) of voltage and the $3^{rd}$ zero crossing signal (ZCI1) of current obtained from the average value computation program, can be easily obtained from the equation, $t_{v1}-t_{i1}$, of counter data value obtained by making use of high speed timer (172) increasing with fixed frequency. It is necessary to design the zero crossing circuit in high precision to increase the accuracy, because even a low level of distortion and noise mixed up with AC voltage (Vis) or AC current (Is) may cause error in the computation of phase difference (ø).

An additional example is that the standard clock (CLK), which is used to generate sinusoidal waveforms from the constant current circuit (5), can be obtained from MPU (1) by frequency dividing the MPU basic operating clock as stated above, and the frequency of the sinusoidal waveform constant current (Is) can be obtained by dividing the standard clock. By this frequency dividing, the basic operating clock and the frequency of the described constant current source is always in synchronization. Therefore, the period of AC voltage and the period AC current (Is) can be obtained easily by counting the basic operation clock of MPU (1) or the standard clock (CLK). By this operation and after determining the periods of each signal, the average voltage (Vavg) and current (Iavg) can be calculated.

Another example of obtaining the value of impedance is by utilizing the following equations of impedance, resistance, and reactance elements, by using the phase difference of AC voltage (Vis) and AC current (Is), which are obtained during the said operating procedure, as follows:

$$Z = \sqrt{R^2 + X^2} = \frac{V_s}{I_s}$$

$$\frac{X}{R} = \tan^{-1} \Phi$$

Shown above is one example of obtaining resistance (the effective impedance element) by multiplying Impedance value (Z) with phase difference cos (Ø), particularly emphasizing the method of accurately obtaining the phase difference (Ø). This method as described has the advantage of reducing the operation time compared to the method of measuring small signal true RMS voltage mixed with ripple when there exists pure impedance voltage signal without noises in the real AC voltage signal ($V_{SM}$), since this method can obtain the phase difference through the hardware of phase detection circuits and simple counter operations and can calculate effective values from the real time values of voltage and current. Also, when compared to the method of obtaining true RMS impedance through complex operations of synchronous detection method (D-Q transformation), this method has another advantage of reducing the amount of MPU calculations needed to obtain the impedance value.

As explained above, the timer interrupt program will be executed at a certain time interval, and it will return to the main program when the execution is finished. Whenever the timer interrupt program executes, the programs to store waveform and to measure impedance waveform will be executed. The timer interrupt program will calculate the number of executions and the counter variables for time measurement, which will increase to reach a certain value, at which it will execute the specified programs or the counter value will be set to an initial zero. The operating principle and conceptual foundation of this invention presents diagnosis of an emergency power supply which is connected to monitor the quality of the power source and to measure and compute the basic data about the battery cells used in the emergency power supply system. The system will do operations to store the above data in a memory device. Based on this basic data, we can calculate internal impedance by using an algorithm of calculating internal impedance of battery cells in MPU. We can also display this data on an LCD which is connected to the monitoring/diagnostic system. When the data or commands are entered by external input devices such as keypads, the pre-specified aging status algorithm program will be executed to check the aging status of battery cells and it would be possible to notify the information on failed batteries, if any, to the manager in the control room via alarm, beep sound, or other communication means about the information on aging status.

Furthermore, the emergency power supply systems suggested here basically consists of 12, 24, 36 cell strings in proportion to the capacity of emergency power supply systems. If the system capacity is to increase, one string would consist of more than 100 cells connected serially or several number of emergency power supply systems can be installed in one place. In the latter case, 4~6 serially connected cell strings will be treated as a single 12V (8V) cell, and one emergency power supply (Monitoring and Diagnostic System) could handle up to 360 cells (6 cell×60). But in this case, it would be difficult to measure or monitor accurately, thus it may be necessary to employ multiple measurement (monitoring) systems.

The FIG. 15 shows the conceptual block diagram of:

i) monitoring multiple emergency power supply systems to monitor the power quality of multiple power supply installed in one place ii) diagnosing the aging status of multiple battery cells by multiple measurement diagnostic systems in real time iii) transmitting the monitoring and diagnostic data acquired in i) and ii) through the means of remote communication network to a remote place.

N emergency power supply systems (160), including the battery cells, the targets for diagnosis and data renewal, or incoming/outcomming power systems, are connected to N measurement/diagnostic systems (161, 164):

i) these N measurement/diagnostic systems (161,164) measure and diagnose the emergency power supply systems (160) with a series of the previously explained concept and methods, ii) and establish a serial interface (162) at the communication port accommodated in the main control unit in order for the measurement and diagnostic systems to hold the said measured data in common, iii) and this serial interface (162) is connected to a local network (163) for mutual connection of N measurement/diagnostic systems in parallel. Of cause, the said local network (163) can also be a wireless communication device. And one specific measurement/diagnostic system among N can be chosen as the main measurement/diagnostic system (164) making it possible to transmit data between the main measurement/diagnostic system and the rest of the measurement/diagnostic systems to remote. Main measurement/diagnostic system can be installed not only with serial interface (162) but also with LAN interface (165) in order to transmit data obtained from N measurement/diagnostic systems to a remote place. LAN interface (165) is connected with a remote communication network (166).

Under these schemes, the main measurement/diagnostic system (164) equipped together with serial interface (162), LAN interface (165) and wireless interface (167) will act as a gateway so that all the data from all the measurement/diagnostic systems can be transmitted via remote communication network (166) such as internet or wireless communication network (168) like CDMA, and also it will act as a gateway to transmit data by wireless communication network (168) like CDMA.

In detail, in FIG. 16, one measurement/diagnostic system (164) among a large number of measurement/diagnostic systems is appointed as main measurement/diagnostic system (164) and the rest are appointed as slave measurement/diagnostic systems (164-$a$, -$b$, -$c$, . . . , -$n$). And the main measurement/diagnostic system (164) executes the control over communication with the accommodation of serial communication such as RS-486, RS-422, RS-232 or serial interface capable of local area communication like Bluetooth, and executes the mutual communication with the slave measurement/diagnostic systems and controls them. And in the local network (163) like PC, adjusting the parameters and accessing and storing the data in the main measurement/diagnostic system (164) and the slave measurement/diagnostic system via each local network (163). The local monitoring system (169), like PC, connected to the main measurement/diagnostic system (164) can adjust the parameters and have access to the data stored in all the slave measurement/diagnostic systems via mutually connected local network (163). And each slave measurement/diagnostic systems can adjust the parameters and have access to the data stored in itself. Furthermore, main measurement/diagnostic system (164) can be connected directly to a wireless communication network or a remote communication network other than the local monitoring system (169), thus making accessible it to all the data in the slave measurement/diagnostic systems.

If one string of batteries is composed of more than a few hundred cells, as shown in FIG. 17, instead of slave measurement/diagnostic systems (164-$a$, -$b$, -$c$, . . . , -$n$), measurement/diagnostic units (1, 2, . . . , N) equipped with simple serial communication port like RS-485, without complicated output device like LCD, it can be installed adjacent to several battery strings to check battery characteristics. This measurement/diagnostic unit consists of a main controller unit (11) with a relatively simple function, constant current source (5), and relaying circuits (4).

In this case, the main measurement/diagnostic system (164) and the measurement/diagnostic units (1, 2, . . . , N) connected by simple serial communication port like RS-485 make it possible to adjust the parameters and to retrieve the stored data in the measurement/diagnostic units by utilizing the main monitoring system (164). And also the local system (169) like PC connected to the measurement/diagnostic system makes it possible to control all the measurement/diagnostic units (adjusting the parameters and retrieving the data) inter-connected by a local network like a serial interface.

Also the main measurement/diagnostic system (164) can be connected to a wireless communication network or a remote network thus making it accessible to all the data in the measurement/diagnostic units (1, 2, . . . , N).

Any slave measurement/diagnostic system in FIG. 16 can be replaced in emergency power supply system (170), and if the communication ports of measurement/diagnostic system and emergency power supply system (170) are mutually connected, data access is possible via the measurement/diagnostic system (164).

With the above method, the host computer or PC in a remote place connected to multiple measurement/diagnostic systems via various communication network (internet, CDMA) commands all kinds of instructions to make each measurement/diagnostic system monitor the emergency power line and acquire the battery characteristic data and handle with the data for the diagnosis of aging status. Hence, aging status analysis of emergency power lines and emergency batteries can be possible by receiving all the data concerned with the measurement/diagnostic systems from remote communication systems.

Besides, in case of employing internet, one fixed internet protocol (IP) attached to a host can control/monitor the operations of more than 1,000 sites on line by controlling N emergency power supply systems on each site by mutual communication via remote communication means, thereby resulting in economic maintenance.

The users of this system are internet data centers, computer centers, mobile telephone relay stations, network communication stations, hospitals, military communication computer facilities, banks, industrial control systems, transportation (road, railroad, subway) control systems, ships, power plants (distribution), and etc. which need a 24 hour constant quality power supply system. This invention is characterized by computerized automation:

i) which enables scientific and automated operation and maintenance, ii) which prevents inoperable system due to the failure of unpredictable secondary power system.

The economic and scientific management of the system can be performed with continuous monitoring of the quality of emergency power system and with early detection, and replacement of battery cells before failure can be done.

Furthermore, the diagnostic system of this invention has the function capable of automatic measurement of battery cell characteristic data when charging/discharging necessary for the formation process of batteries, and can be utilized to analyze the status of battery cells when charging/discharging besides the purpose of aging status diagnosis, as the data base about the terminal voltage and internal impedance of each battery cell can be done in a short time.

As explained earlier, the true value of impedance voltage (Vis) can be obtained by effectively filtering the computed values from noise, even though impedance voltage is acquired mixed up with noise. Therefore, for medical diagnosis for edematous part, the measurement signal can be separated and obtained in the noise voltage even though noise comes in together with input signal.

The invention claimed is:

1. A battery diagnostic system configured to: measure the characteristic of a storage battery system (3) comprising a plurality of storage batteries; diagnose an aging status of the storage battery system, and manage history data relating to the characteristics of the storage battery system (3), the system comprising:
   a main processor unit MPU (1) configured to:
      control a storage battery cell to be measured,
      control an amplifier of an automatic scaling circuit (7),
      control the generation of a AC constant current (Is) applied to the storage battery cell, obtaining waveforms of an impedance voltage (Vis) and the AC constant current (Is) when the AC constant current (Is) is generated,
      determine measurement data including a terminal voltage (VD), current (I), and temperature (t) of the storage battery cell, and
      calculate internal impedance of the storage battery cell using the AC constant current (Is) and the impedance voltage (Vis); and
   a constant current source (5) configured to generate the AC constant current (Is) applied to the storage battery cell, wherein the constant current source (5) is configured to turn on and off according under control of the MPU (1), wherein a frequency of the constant current source (5) is determined by the MPU (1);
   an A/D converter (6) connected to the constant current source (5) and the automatic scaling circuit (7), the A/D converter configured to convert each signal output from the constant current source (5) and the automatic scaling circuit (7) into a digital signal; and
   a communication port (8) configured to transmit the measurement data determined by the MPU (1) to a computer;
   wherein the automatic scaling circuit (7) comprises:
      a plurality of operational amplifiers (50) having different amplifying gains; and
      a signal selector (51) connected to output ends of the plurality of operational amplifiers (50) and configured to select one of the plurality of operational amplifiers (50) and automatically scale a size of the impedance voltage (Vis) obtained when the AC constant current (Is) is generated.

2. The system according to claim 1 further comprising:
   a group of relaying circuits (4) connected between the constant current source (5) and the storage battery system (3), the group of relaying circuits (4) having a plurality of relays connected in parallel to the plurality of storage battery cells, and configured to selectively switch and connect a measurement signal including the impedance voltage (Vis) obtained from the storage battery cell to the MPU (1) according to a select control signal of the MPU (1).

3. The system according to the claim 2 wherein:
   the select control signal, configured to control the relay connections to the battery cells being composed of 6 bit signal;
   one group among the up to four groups of relaying circuits being selected by 2 bits of the 6 bit signal; and
   the remaining 4 bits being inputted to input terminals (D0-D3) of a decoder circuit (MUX), wherein the 4 bits are configured to select one of up to 16 relay assemblies among the group of relaying circuits selected by the 2 bit signal.

4. The system according to the claim 1 wherein:
   a clock signal (CLK) driven from the MPU (1) is inputted to the constant current source (5);
   the frequency of the AC constant current (Is) of the constant current source (5) is driven from the clock signal (CLK);
   and wherein periods of impedance voltage (Vis) and AC constant current (Is) are determined based on the clock signal.

5. The system according to the claim 1, wherein the constant current source (5) comprises:
   an operational amplifier (31) configured to generate a difference (−) signal between an AC output feedback signal (If) and a current set value by using the AC output feedback signal (If) as an input signal, and
   a sinusoidal waveform generation circuit (33) receiving an output signal from the operational amplifier (31) and a clock signal (CLK) driven from a basic clock of the MPU (1) and generating an AC sinusoidal waveform,
   wherein the clock signal (CLK) is input into a soft start circuit (39) to produce a soft start signal (ss), the soft start signal (ss) being coupled to an output of the operational amplifier (31).

6. The system according to the claim 5:
   wherein an output signal of the sinusoidal waveform generation circuit (33) is differentially operated with an AC output current feedback signal (If) in an instantaneous value addition circuit (34), an output of circuit (34) being input into a No. 1 B class amplifier circuit (35), wherein the No. 1 B class amplifier circuit (35) comprises an NPN transistor (Q1), a PNP transistor (Q2), and an operational amplifier (U3); and
   wherein an output of the operational amplifier (U3) is connected to each base of a NPN transistor (Q1) and a PNP transistor (Q2),
   wherein a primary winding of a signal transformer (T2) is connected to a common point of each emitter of NPN transistor (Q1) and PNP transistor (Q2), and an amplified output signal is output through the signal transformer (T2) and is simultaneously feedback to an inverting (−) input of the operational amplifier (U3).

7. The system according to the claim 1 wherein the automatic scaling circuit (7) includes:
   a measurement signal commonly connected with inputs of several operational amplifiers (50), operation amplifiers (50) having predetermined and different amplifying gains;

outputs of the several operational amplifiers (50) being connected to an input of the signal selector (51);

the signal selector (51) having a common output connected to an input terminal of the A/D converter (6);

the operational amplifier with proper amplifying gain being selected among the said operational amplifiers (50);

wherein the operational amplifier having maximum output without saturation being selected from among the several operational amplifiers (5) based upon a first checking of the output of the amplifier with the highest gain first, then the amplifier with the next highest gain until finding the amplifier without saturation.

8. The system according to the claim 2 wherein:

a clock signal (CLK) driven from the MPU (1) is inputted to the constant current source (5);

the frequency of the AC constant current (Is) of the constant current source (5) being driven from the clock signal (CLK);

wherein periods of impedance voltage (Vis) and AC constant current (Is) are determined based on the clock signal.

* * * * *